United States Patent
Kato

(10) Patent No.: US 6,771,354 B2
(45) Date of Patent: Aug. 3, 2004

(54) VIBRATION DAMPING APPARATUS, CONTROL METHOD THEREFOR, EXPOSURE APPARATUS HAVING THE VIBRATION DAMPING APPARATUS, MAINTENANCE METHOD THEREFOR, SEMICONDUCTOR DEVICE FABRICATION METHOD, AND SEMICONDUCTOR FABRICATION FACTORY

(75) Inventor: Hiroaki Kato, Kanagawa (JP)

(73) Assignee: Canon Kabushi Kaisha, Tokyo (JP)

( * ) Notice: Subject to any disclaimer, the term of this patent is extended or adjusted under 35 U.S.C. 154(b) by 0 days.

(21) Appl. No.: 10/289,263

(22) Filed: Nov. 7, 2002

(65) Prior Publication Data

US 2003/0090645 A1 May 15, 2003

(30) Foreign Application Priority Data

Nov. 13, 2001 (JP) ........................................ 2001-347472

(51) Int. Cl.[7] ........................... G03B 27/58; G03B 27/62
(52) U.S. Cl. ............................................ 355/72; 355/75
(58) Field of Search ............................ 355/53, 77, 72, 355/75

(56) References Cited

U.S. PATENT DOCUMENTS

| | | | | |
|---|---|---|---|---|
| 4,848,525 A | * | 7/1989 | Jacot et al. ................. 188/378 |
| 5,812,396 A | | 9/1998 | Kato ....................... 364/167.07 |
| 5,812,420 A | * | 9/1998 | Takahashi ................... 700/280 |
| 5,876,012 A | * | 3/1999 | Haga et al. .................. 248/550 |
| 6,155,542 A | | 12/2000 | Kato et al. ................... 267/136 |
| 6,170,622 B1 | | 1/2001 | Wakui et al. ................ 188/378 |
| 6,286,644 B1 | | 9/2001 | Wakui ........................ 188/378 |
| 6,385,497 B1 | * | 5/2002 | Ogushi et al. .............. 700/110 |
| 6,473,159 B1 | * | 10/2002 | Wakui et al. ................ 355/53 |

FOREIGN PATENT DOCUMENTS

| | | |
|---|---|---|
| JP | 6-28698 | 2/1994 |
| JP | 2000-274482 | 10/2000 |

* cited by examiner

*Primary Examiner*—Russell Adams
*Assistant Examiner*—D. Ben Esplin
(74) *Attorney, Agent, or Firm*—Fitzparrick, Cella, Harper & Scinto

(57) ABSTRACT

An anti-vibration apparatus includes a table, an actuator system which applies a force to the table, a first system which applies to the actuator system a first signal for causing the actuator system to apply the force in proportion to a displacement of the table, and a second system which applies to the actuator system a second signal for causing the actuator system to apply the force based on an acceleration of the table. The first and second signals are generated by the first and second systems, respectively, so that a natural vibration mode of a system including the table and the actuator system is unchanged.

15 Claims, 14 Drawing Sheets

FIG. 12

| | |
|---|---|
| URL | http://www.maintain.co.jp/db/input.html |

TROUBLE DB INPUT WINDOW

DATE OF OCCURRENCE OF TROUBLE  [2000/3/15] ~404
MODEL  [**********] ~401
TROUBLE CASE NAME  [OPERATION ERROR (START-UP ERROR)] ~403
SERIAL NUMBER  [465NS4580001] ~402
EMERGENCY LEVEL  [D] ~405

PROBLEM  [LED KEEPS FLICKERING AFTER POWER ON] ~406

REMEDY  [POWER ON AGAIN (PRESS RED BUTTON IN ACTIVATION)] ~407

PROGRESS  [INTERIM HAS BEEN DONE] ~408

[SEND] [RESET]   410   411   412
LINK TO RESULT LIST DATABASE   SOFTWARE LIBRARY   OPERATION GUIDE

VIBRATION DAMPING APPARATUS, CONTROL METHOD THEREFOR, EXPOSURE APPARATUS HAVING THE VIBRATION DAMPING APPARATUS, MAINTENANCE METHOD THEREFOR, SEMICONDUCTOR DEVICE FABRICATION METHOD, AND SEMICONDUCTOR FABRICATION FACTORY

FIELD OF THE INVENTION

The present invention relates to a vibration damping apparatus which reduces vibrations of a structure such as an exposure apparatus used to fabricate various devices such as a semiconductor chip including an IC or LSI, a display element including a liquid crystal panel, a detection element including a magnetic head, and an image sensing element including a CCD, a control method for the vibration damping apparatus, an exposure apparatus having the vibration damping apparatus, a maintenance method therefor, a semiconductor device fabrication method, and a semiconductor fabrication factory.

BACKGROUND OF THE INVENTION

Precision apparatuses such as an electron microscope and an exposure apparatus applied to a semiconductor fabrication process must minimize and cut off vibrations transferred from the outside and vibrations transferred to the outside, and must incorporate (or be mounted on) a vibration damping apparatus which reduces and cuts off vibrations. Particularly, in the exposure apparatus, an exposure X-Y stage continuously moves at a high speed. The vibration damping apparatus must realize high-precision vibration damping performance against external vibrations and high-precision vibration suppression performance against internal vibrations generated by the mounted apparatus itself.

To meet this demand, active vibration damping apparatuses have recently been put into practical use. This vibration damping apparatus can achieve effective vibration control by driving an actuator in accordance with a detection signal from a vibration sensor.

A passive vibration damping apparatus is comprised of only a support mechanism having spring and damper characteristics, and exhibits a tradeoff between the vibration damping performance and the vibration suppression performance. If the vibration damping performance is preferred in the passive vibration damping apparatus, low stiffness and low viscosity are demanded of the support mechanism. This demand degrades the vibration suppression performance.

The advantage of the active vibration damping apparatus is that it can satisfy both the vibration damping performance and vibration suppression performance. The vibration sensor and actuator can realize the viscosity and stiffness of a skyhook whose fulcrum is an absolute rest point in the space.

The feature of the active vibration damping apparatus is to set a vibration sensor on a vibration damping table which supports a precision apparatus and to feed back a detection signal from the vibration sensor to the actuator. A vibration damping apparatus disclosed in Japanese Patent Laid-Open No. 2000-274482 (active vibration damping apparatus, exposure apparatus and method, and device fabrication method) adopts a feedback loop which applies the stiffness of a skyhook to a vibration damping table together with the viscosity of the skyhook. According to this reference, the vibration damping apparatus has a vibration measurement unit which measures vibrations of the vibration damping table and those of an actuator serving as an air spring which supports the vibration damping table. By supporting the vibration damping table by a stiffness element such as the actuator serving as an air spring, vibrations transferred from the installation floor to the vibration damping table are cut off. The vibration damping apparatus also comprises an acceleration/velocity feedback loop. An acceleration and velocity based on an output from the vibration measurement unit are fed back to the actuator serving as an air spring, applying the viscosity and stiffness of the skyhook to the vibration damping table. The "skyhook" means that an absolute rest point in the space is used as a fulcrum. The viscosity and stiffness of the skyhook keep the vibration damping table absolutely at rest. The stiffness suppresses displacement, and the viscosity quickly damps residual vibrations.

For effective vibration control, a vibration damping apparatus having both the viscosity and stiffness of a skyhook is desirable, as disclosed in the reference. Most of conventional vibration damping apparatuses realize only the skyhook viscosity through a feedback loop. The first step of vibration control is to damp residual vibrations, and many vibration damping apparatuses are equipped with only a minimum function of realizing the skyhook viscosity.

However, only the viscosity cannot fully demonstrate the ability of the vibration damping apparatus. Realization of the skyhook stiffness is desired for higher-precision vibration control.

One of the reasons why no conventional vibration damping apparatus realizes the skyhook stiffness is that an acceleration sensor has conventionally been used for vibration measurement in the vibration control field, as considered in Japanese Patent Laid-Open No. 2000-274482 described above. The acceleration sensor, also called a tilt sensor, can detect from a direct current to a high-frequency component. When, however, vibrations are actually measured using the acceleration sensor, almost no very low frequencies are observed. The physical quantity of velocity is a first-order integral of the acceleration, and the velocity sensor has a higher sensitivity to a lower frequency than the acceleration sensor. In other words, the velocity sensor is more advantageous than the acceleration sensor to low-frequency vibration measurement. The skyhook stiffness contains a low-frequency component in the control band, and the above reference realizes effective skyhook stiffness by using the velocity sensor.

There is another technical problem which obstructs realization of the skyhook stiffness. This problem is changes in a natural mode accompanying application of the stiffness. The rigid-body motion of the vibration damping table has natural modes equal in number to the degree of freedom of motion. From the viewpoint of dynamics, the vibration damping table is modeled into a stiffness element, and the air spring which supports the vibration damping table is modeled into a stiffness element (spring element). As is well known, the rigid-body spring system has natural modes equal in number to the degree of freedom of motion of the rigid body. Thus, the rigid-body motion of the vibration damping table has a natural mode which is a phenomenon unique to the rigid-body spring system.

The frequency in the natural mode is called a natural frequency, and the direction or state of the natural mode is called a mode shape. Upon applying disturbance vibrations similar in direction to frequency, vibrations excited in the system are converted into a natural mode. That is, not only are various vibrations generated in the vibration damping table, but also, vibrations are excited mainly in the natural mode.

The skyhook viscosity so acts as to apply damping to the natural mode. It should be noted that the natural mode is kept unchanged regardless of the presence/absence of viscosity. This is because the natural mode is determined by the inertia and stiffness of the system regardless of the viscosity. As long as the feedback loop which realizes the viscosity is appropriate, damping can be applied to all natural modes.

The skyhook stiffness influences the natural mode. The skyhook stiffness applies new stiffness using the space as a fulcrum to the vibration damping table, and the natural mode changes depending on the presence/absence of the stiffness. Changes in natural mode should be prevented because of the following reasons.

First, the natural mode is a basic design specification in the design of a mechanical structure such as a vibration damping apparatus. The movable direction and range of a movable mechanism are designed based on the natural mode. This also applies to the layout of the vibration sensor and actuator, and their layout is determined in consideration of the observability and controllability of the natural mode. The mechanical structure of the vibration damping apparatus is designed based on the natural mode, and the natural mode is desirably kept unchanged regardless of the presence/absence of the feedback loop.

Second, changes in natural mode inhibit the performance evaluation of the vibration damping apparatus. The primary role of the vibration damping apparatus is to cut off vibrations transferred from the installation floor. The floor vibration transmissibility is one of indices for performance evaluation. The floor vibration transmissibility is measured by installing vibration sensors on both the vibration damping table and installation floor in two horizontal directions and the vertical direction. Measurement in the two horizontal directions and the vertical direction is performed because the sense of directions is clear and the vibration sensors basically detect vibrations in horizontal or vertical translation. In general, the vibration damping table has natural modes corresponding to translations in the two horizontal directions and the vertical direction. With the presence of such natural modes, vibrations from the installation floor and vibrations from the vibration damping table exhibit a high correlation upon measurement by the vibration sensors. Thus, the floor vibration transmissibility can be measured at a high precision. Application of the skyhook stiffness may decrease the measurement precision of the floor vibration transmissibility. This is because applying the stiffness may change the natural mode in a direction different from translations in the two horizontal directions and the vertical direction. Considering the performance evaluation of the vibration damping apparatus, the natural mode is desirably kept unchanged.

Third, the natural mode is a basic design specification of the vibration damping apparatus, but an improper natural mode different from the design may be realized. The natural mode becomes different from the design owing to characteristic variations of the structure of the vibration damping apparatus and the shape and weight of a precision apparatus mounted on the vibration damping table. This inhibits smooth operation of the movable mechanism of the vibration damping apparatus and the layout of the vibration sensor and actuator. In this case, the natural mode is desirably shaped into a proper one by a feedback loop operation.

SUMMARY OF THE INVENTION

The present invention has been made in consideration of the above situation, and has as its object to provide a vibration damping apparatus capable of fixing the natural mode of the rigid-body motion of a vibration damping table even upon applying the stiffness of a skyhook to the vibration damping table in a feedback lop.

It is another object of the present invention to provide a vibration damping apparatus capable of arbitrarily adjusting the natural mode of the rigid-body motion of the vibration damping table.

To solve the conventional problems and to achieve the above objects, there are provided a vibration damping apparatus and a control method, comprising a vibration damping unit which reduces vibrations of a structure, a support unit which supports the vibration damping unit, an actuator which applies a vibration suppression force to the vibration damping unit, a vibration sensor which detects vibrations of the vibration damping unit, and a controller having a feedback loop which so controls as to drive the support unit and the actuator in accordance with a detection result of the vibration sensor and to apply stiffness, viscosity, and inertia to the vibration damping unit, wherein the controller applies the inertia in accordance with physical parameters of the vibration damping unit and the support unit and the stiffness so as not to change a natural mode of rigid-body motion of the vibration damping unit depending on the presence/absence of the feedback loop.

Also, there are provided a vibration damping apparatus and a control method therefor according to the present invention, comprising a vibration damping unit which reduces vibrations of a structure, a support unit which supports the vibration damping unit, an actuator which applies a vibration suppression force to the vibration damping unit, a vibration sensor which detects vibrations of the vibration damping unit, and a controller having a feedback loop which so controls as to drive the support unit and the actuator in accordance with a detection result of the vibration sensor and to apply stiffness, viscosity, and inertia to the vibration damping unit, wherein the controller applies the stiffness in accordance with physical parameters of the vibration damping unit and the support unit and the inertia so as not to change a natural mode of rigid-body motion of the vibration damping unit depending on presence/absence of the feedback loop.

According to these apparatuses and methods, the vibration damping unit which supports a precision apparatus or the like is supported by an air spring serving as the support unit. The actuator such as a linear motor applies a vibration suppression force to the vibration damping unit. The air spring functions as a support leg which supports the vibration damping unit, and as an actuator which controls the internal pressure to apply a vibration suppression force to the vibration damping unit. The vibration sensor detects vibrations of the vibration damping unit. "Vibrations" mean the absolute acceleration and velocity of the vibration damping unit with respect to the space. The stiffness and viscosity of the skyhook and the inertia are applied to the vibration damping unit by driving actuators such as the air spring and linear motor in accordance with an output from the vibration sensor. In general, application of the stiffness to the vibration damping unit changes the natural mode of the rigid-body motion of the vibration damping unit. The inertia is so applied as to keep the natural mode unchanged. The inertia is applied in accordance with the physical parameters of the vibration damping unit and air spring, and application of the stiffness. The physical parameters of the vibration damping unit and air spring mean the mass, moment of inertia, and inertia product of the vibration damping unit, the stiffness of the air spring SU, and the like.

Also, there are provided a vibration damping apparatus and a control method therefor according to the present invention, comprising a vibration damping unit which reduces vibrations of a structure, a support unit which supports the vibration damping unit, an actuator which applies a vibration suppression force to the vibration damping unit, a vibration sensor which detects vibrations of the vibration damping unit, and a controller having a feedback loop which so controls as to drive the support unit and the actuator in accordance with a detection result of the vibration sensor and to apply stiffness, viscosity, and inertia to the vibration damping unit, wherein the controller applies the inertia in accordance with physical parameters of the vibration damping unit and the support unit and the stiffness so as to arbitrarily adjust a natural mode of rigid-body motion of the vibration damping unit.

Also, there are provided a vibration damping apparatus and a control method therefor according to the present invention, comprising a vibration damping unit which reduces vibrations of a structure, a support unit which supports the vibration damping unit, an actuator which applies a vibration suppression force to the vibration damping unit, a vibration sensor which detects vibrations of the vibration damping unit, and a controller having a feedback loop which so controls as to drive the support unit and the actuator in accordance with a detection result of the vibration sensor and to apply stiffness, viscosity, and inertia to the vibration damping unit, wherein the controller applies the stiffness in accordance with physical parameters of the vibration damping unit and the support unit and the inertia so as to arbitrarily adjust a natural mode of rigid-body motion of the vibration damping unit.

According to these apparatuses and methods, the inertia is so applied as to arbitrarily adjust the natural mode of the rigid-body motion of the vibration damping unit. The inertia is applied in accordance with the physical parameters of air springs serving as the vibration damping unit and support unit, and application of the stiffness.

It is preferable that a correspondence table between the stiffness and the inertia be held in advance, and the feedback loop be operated in accordance with the correspondence table.

An exposure apparatus according to the present invention comprises the above vibration damping apparatus.

The present invention can be applied to a semiconductor device fabrication method comprising the step of installing fabrication apparatuses for performing various processes, including the exposure apparatus of the present invention, in a semiconductor fabrication factory, and the step of fabricating a semiconductor device by performing a plurality of processes using the fabrication apparatuses.

The semiconductor device fabrication method preferably further comprises the step of connecting the fabrication apparatuses by a local area network, and the step of communicating information about at least one of the fabrication apparatuses between the local area network and an external network outside the semiconductor fabrication factory.

Preferably, a database provided by a vendor or user of the exposure apparatus is accessed via the external network to obtain maintenance information about the fabrication apparatus by data communication, or data communication is performed between the semiconductor fabrication factory and another semiconductor fabrication factory via the external network to perform production management.

The present invention can be applied to a semiconductor fabrication factory comprising fabrication apparatuses for performing various processes, including the exposure apparatus of the present invention, a local area network which connects the fabrication apparatuses, and a gateway which allows the local area network to access an external network outside the factory, wherein information about at least one of the fabrication apparatuses can be communicated.

The present invention can be applied to a maintenance method for the exposure apparatus of the present invention that is installed in a semiconductor fabrication factory, comprising the step of causing a vendor or user of the exposure apparatus to provide a maintenance database connected to an external network outside the semiconductor fabrication factory, the step of granting access to the maintenance database in the semiconductor fabrication factory via the external network, and the step of transmitting maintenance information accumulated in the maintenance database to the semiconductor fabrication factory via the external network.

The exposure apparatus according to the present invention further comprises a display, a network interface, and a computer which executes network software, and maintenance information about the exposure apparatus can be communicated via a computer network.

The network software preferably provides on the display a user interface for accessing a maintenance database which is provided by a vendor or user of the exposure apparatus and connected to an external network outside a factory where the exposure apparatus is installed, and enables obtaining information from the database via the external network.

As described above, according to the present invention, vibrations of the vibration damping table are suppressed by applying the stiffness and viscosity of the skyhook and the inertia to the vibration damping table. The natural mode of the rigid-body motion of the vibration damping table is kept unchanged regardless of the presence/absence of the feedback loop. Hence, a feedback loop for each motion mode operates preferably. The movable range of the vibration damping apparatus and the layout of the vibration sensor and actuator need not be redesigned. According to the present invention, the natural mode of the rigid-body motion of the vibration damping table can be arbitrarily adjusted. The natural mode can be shaped into a desirable one. The present invention can provide a vibration damping apparatus capable of preferable vibration damping control, and a high-precision semiconductor exposure apparatus having the vibration damping apparatus.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

FIG. 12 is a particular example of a user interface;

DETAILED DESCRIPTION OF THE PREFERRED EMBODIMENTS

Preferred embodiments of the present invention will be described in detail below with reference to the accompanying drawings.

The following embodiments are merely an example of the realization means of the present invention. The following embodiments can be variously modified within the spirit and scope of the invention.

The rigid-body motion of a vibration damping table originally has six degrees of freedom. For descriptive convenience, the vibration damping apparatus is assumed to have one degree of freedom, and a method of applying stiffness, viscosity, and inertia to the vibration damping table in feedback loop operation will be explained.

Figure 5:
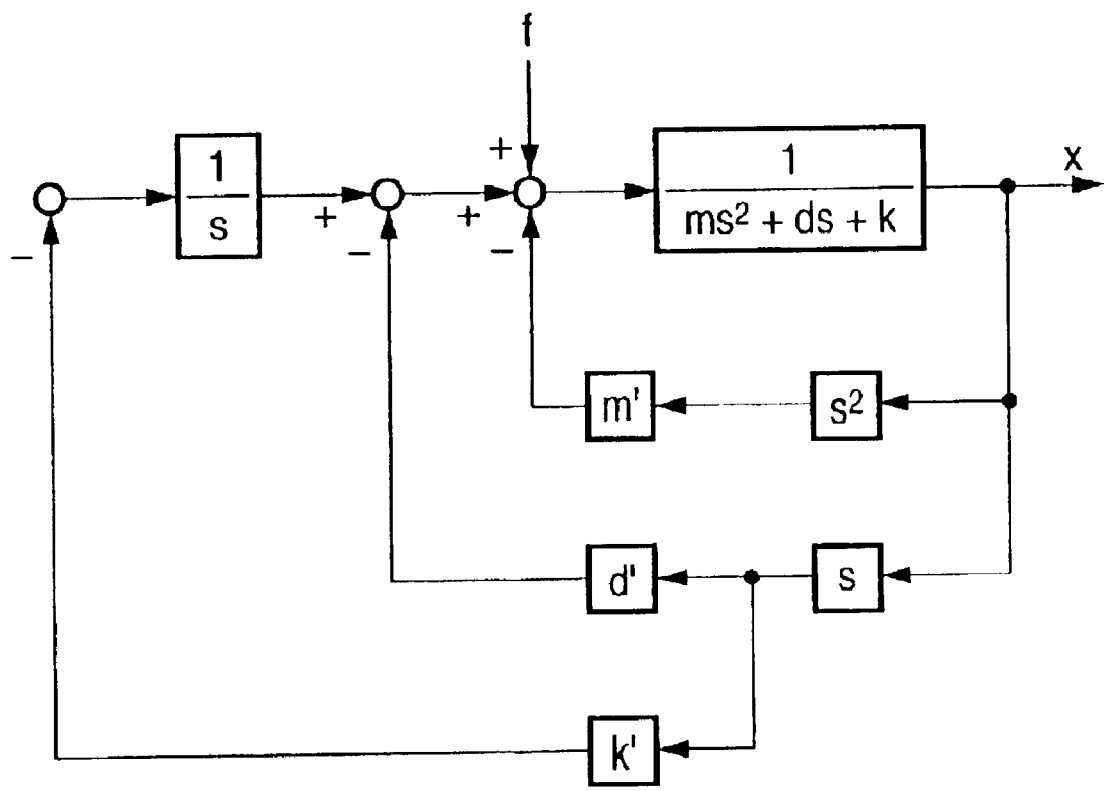
FIG. 5 is a block diagram showing a feedback loop for a vibration damping apparatus with one degree of freedom.

FIG. 5 is a block diagram showing the feedback loop for the vibration damping apparatus with one degree of freedom. In FIG. 5, a block "$1/(ms^2+ds+k)$" represents the dynamic characteristic of the displacement/force response of the vibration damping table. s in the block represents the Laplace operator; m, the mass of the vibration damping table; d, the viscosity of the support mechanism of the vibration damping table; and k, the stiffness of an air spring serving as the support mechanism of the vibration damping table. x represents the displacement of the vibration damping table; and f, the disturbance force which acts on the vibration damping table. Other blocks represent a feedback loop, and a transfer function from f to x is given by $$x/f=1/\{(m+m')s^2+(d+d')s+(k+k')\} \quad (1)$$

where m', d', and k' are effects realized by the feedback loop, and are the inertia, viscosity, and stiffness, respectively.

The feedback loop so operates as to properly manipulate the term of each order of s on the right side of equation (1). In FIG. 5, the feedback loop for an acceleration $s^2x$ of the vibration damping table applies a vibration suppression force proportional to the acceleration $s^2x$ to the vibration damping table. The feedback loop so functions as to apply, to the vibration damping table, inertia equal to m' which is the gain of the feedback loop. "Application of the inertia" is an effect representing a dynamic behavior as if the inertia of the vibration damping table increased. For a model with one degree of freedom as shown in FIG. 5, the term representing the inertia is the term $(m+m')s^2$ on the right side of equation (1). "Application of the inertia" is an effect representing a dynamic behavior as if the mass m of the vibration damping table increased to m+m'. In this embodiment, the inertia is applied by feeding back an acceleration signal to a linear motor serving as an actuator.

The feedback loop for a velocity sx of the vibration damping table is branched into two. One branch applies a vibration suppression force proportional to the velocity sx to the vibration damping table. This branch so functions as to apply, to the vibration damping table, viscosity equal to d' which is a loop gain. In this embodiment, the viscosity is realized by feeding back a velocity signal to the linear motor. The other branch generates a vibration suppression force by first-order integration of the velocity sx. The branch so functions as to apply, to the vibration damping table, stiffness equal to k' which is a loop gain. In FIG. 5, a block "1/s" represents first-order integration. In this embodiment, a viscosity signal is fed back to the air spring. The integral characteristic of the air spring itself realizes stiffness application. In FIG. 5, the block "1/s" represents the integral characteristic of the air spring. The inertia, viscosity, and stiffness applied to the vibration damping table can be set to proper ones by adjusting the gain of the feedback loop.

The method of realizing the stiffness, viscosity, and inertia by the feedback loop in a vibration damping table with one degree of freedom has been described. The natural mode poses a problem in a system with a multidegree-of-freedom system. General vibration damping apparatuses are multidegree-of-freedom systems. This embodiment targets a vibration damping apparatus of a multidegree-of-freedom system.

A vibration damping apparatus according to the embodiment of the present invention will be described in detail.

Figure 1:
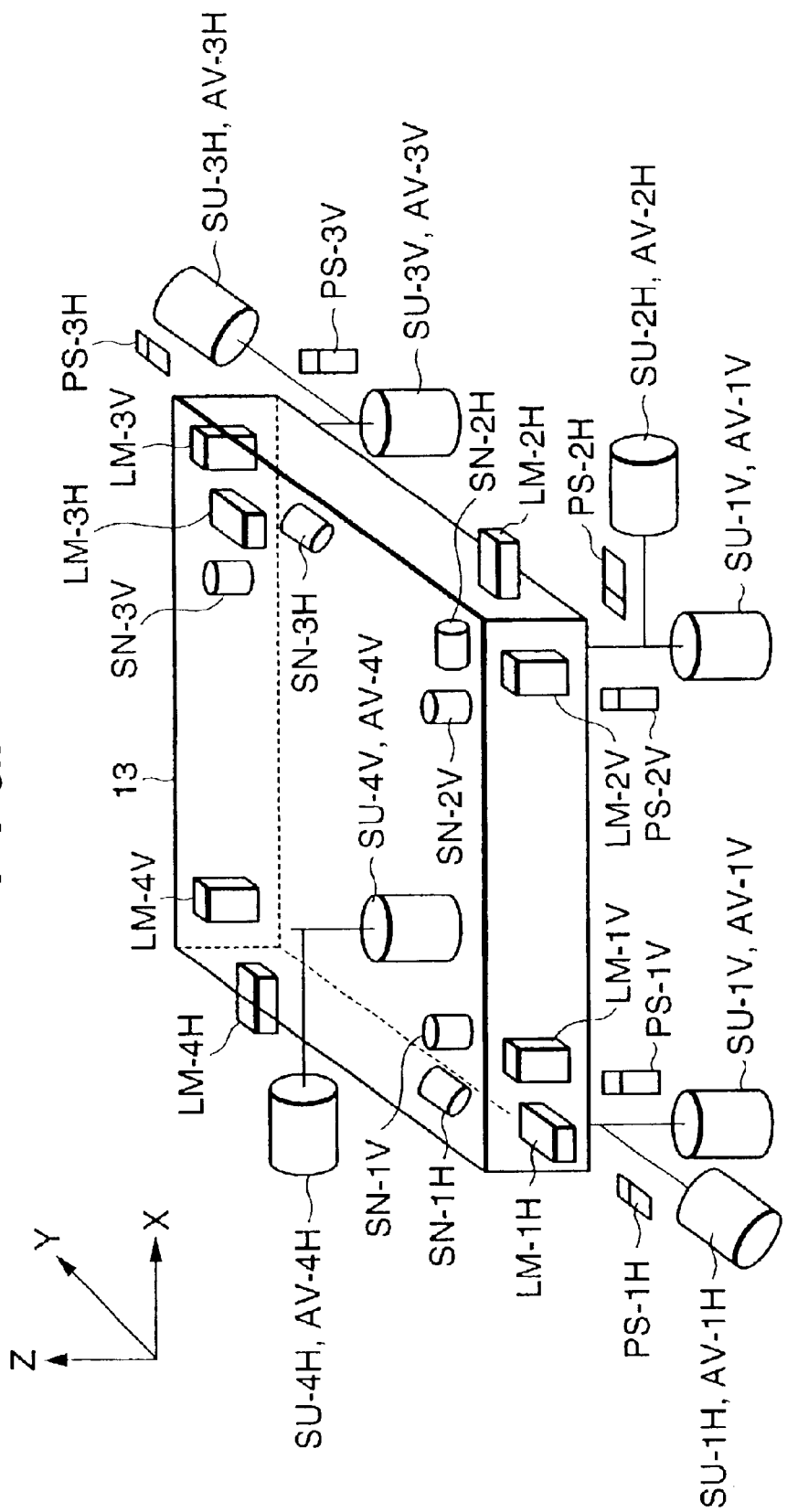
FIG. 1 is a view showing the structure of a vibration damping apparatus according to an embodiment of the present invention.

FIG. 1 is a view showing the mechanical structure of the vibration damping apparatus according to the embodiment of the present invention.

As shown in FIG. 1, the X-Y-Z coordinate system is set such that the X-axis coincides with the right-to-left direction of the apparatus; the Y-axis, with the direction of depth of the apparatus; and the Z-axis, with the vertical direction.

A vibration damping table 13 has a rectangular parallelepiped shape, and comprises air springs SU, actuators LM, and the like at four corners. Building components with suffixes "-1V" and "-1H" on the lower left side of FIG. 1 will be explained.

Vibration sensors SN-1V and SN-1H are servo receivers having two, velocity and acceleration, outputs. An acceleration sensor is generally used for vibration measurement, but this embodiment adopts a servo receiver capable of simultaneously outputting a velocity and an acceleration. The servo receiver operates by the same principle as that of a servo acceleration sensor, which has widely been used. The servo receiver can directly measure a velocity. Application of the viscosity as the principle of vibration control is a physical phenomenon regarding the velocity. The velocity can be directly measured with a merit without arithmetic processing from an acceleration signal.

Details of the servo receiver are disclosed in Japanese Utility Model Publication No. 6-28698 (servo receiver), and its schematic structure will be explained.

Figure 7:
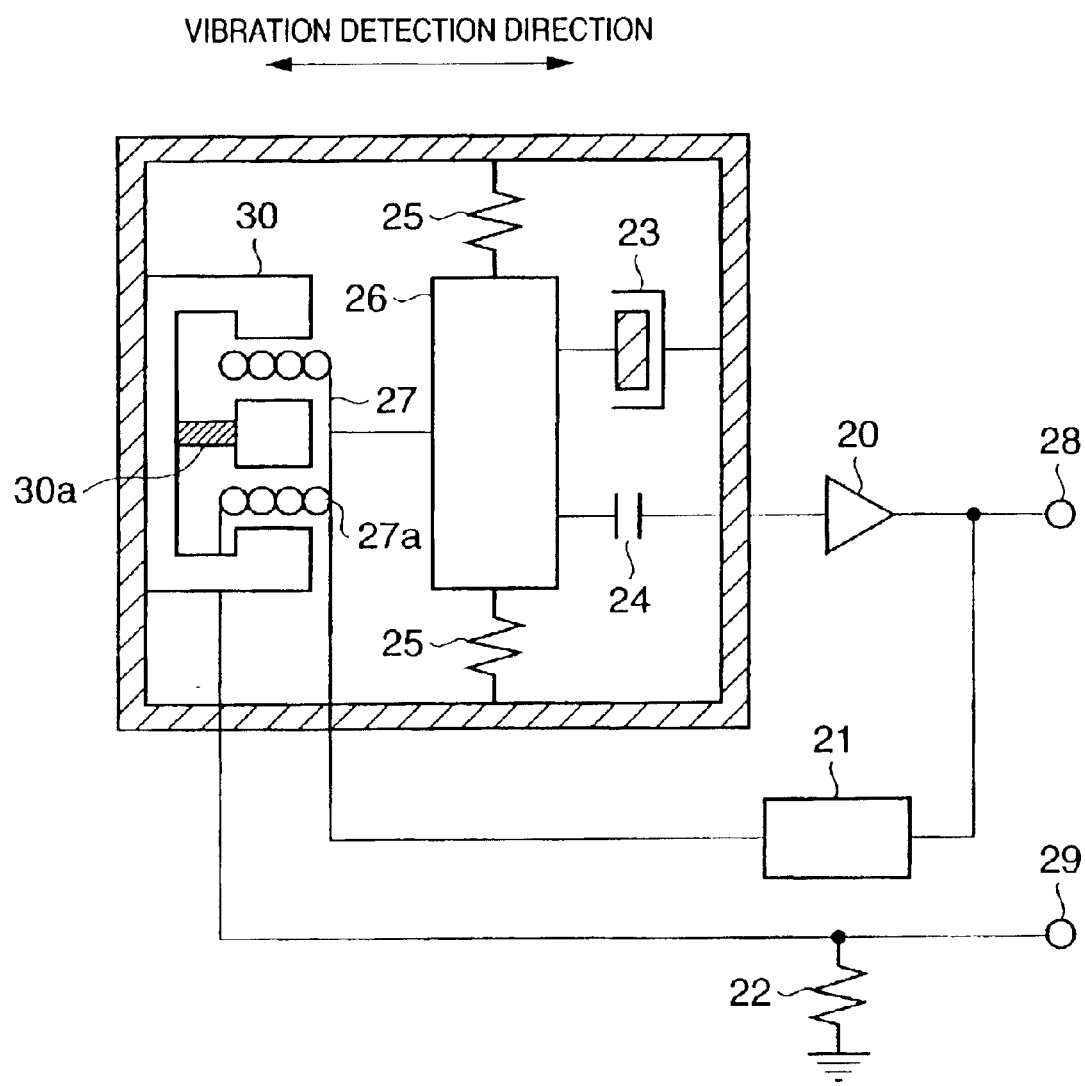
FIG. 7 is a view showing the structure of a servo receiver.

FIG. 7 shows the schematic structure of the servo receiver. A pendulum 26 and movable portion 27 are integrated and are movable in the vibration detection direction. The pendulum 26 is supported by a support spring 25 and given viscosity by a damper 23. A displacement detector 24 detects the displacement of the pendulum 26 in the vibration detection direction. A current is supplied to a movable coil 27a via an amplifier 20 and a differentiator 21 with respect to an output from the displacement detector 24, thus applying a restoring force to the pendulum 26 by the movable coil 27a and the operation of a core 30 and permanent magnet 30a. A velocity output appears at a a velocity detection terminal 28. The current flowing through the movable coil 27a is detected by a current detection resistor 22, and an acceleration output appears at an accelerations detection terminal 29.

Referring back to FIG. 1, the operation of the vibration sensors SN-1V and SN-1H will be explained.

The vibration sensor SN-1V detects the vertical acceleration and velocity of the vibration damping table 13. Similarly, the vibration sensor SN-1H is attached to the horizontal Y direction, and detects the acceleration and velocity of the vibration damping table 13 in the horizontal Y direction. Accelerations and velocities detected by the vibration sensors SN-1V and SN-1H are absolute accelerations and absolute velocities with respect to the space. Detection signals from the vibration sensors SN-1V and SN-1H are fed back to the actuator to realize the viscosity and stiffness of the skyhook.

The present invention shows inertia which is effective for keeping the natural mode unchanged upon applying stiffness and inertia to the vibration damping table by using a vibration sensor signal. This embodiment is not limited to the use of servo receivers as the vibration sensors SN-1V and SN-1H, and a velocity signal may be obtained by first-order integration of a sensor signal by using a generally used acceleration sensor.

An air spring SU-1V vertically supports the vibration damping table 13. The air spring SU-1V cuts off transfer of vibrations from the installation floor to the vibration damping table 13 by a vibration cutoff characteristic which is an air spring characteristic. The air spring SU-1V is a support leg, and at the same time plays the role of an actuator which applies a vibration suppression force to the vibration damping table 13. The internal pressure of the air spring SU-1V is actively controlled to generate a vibration suppression force. For this purpose, the air spring SU-1V comprises an air valve AV-1V. The air valve AV-1V is a pressure-controlled air valve, and controls the internal pressure of the air spring SU-1V in accordance with an input signal. In general, a pneumatic actuator as a combination of the air spring SU-1V and air valve AV-1V generates a vibration suppression force by integration with respect to an input signal to the air valve AV-1V. When this pneumatic actuator is used as an actuator built in a feedback loop, an acceleration signal is fed back to the air valve AV-1V to give viscosity to the vibration damping table 13. In addition, a velocity signal is fed back to apply stiffness.

The air spring SU-1V generates a thrust sufficient to support a heavy member such as the vibration damping table 13, and is widely adopted as a support leg. As an actuator for actively controlling vibrations, the air spring SU-1V has an integral characteristic and facilitates signal processing of a vibration sensor. That is, the viscosity and stiffness of the skyhook can be realized without any complicated calculation such as differentiation or integration of an acceleration signal based on an output from the vibration sensor.

The air spring SU-1H supports the vibration damping table 13 in the horizontal Y direction. The air spring SU-1H has a vibration cutoff characteristic and is used as an actuator which applies a vibration suppression force to the vibration damping table 13, similar to the air spring SU-1V.

A linear motor LM-1V is an actuator which applies a vertical vibration suppression force to the vibration damping table 13. The dynamic characteristic of the linear motor LM-1V is distributed to much higher frequencies than the natural frequency of the rigid-body motion of the vibration damping table 13. When the linear motor LM-1V is used as an actuator built in a feedback loop, a velocity signal is fed back to apply the viscosity to the vibration damping table 13. An acceleration signal is fed back to apply the inertia. A linear motor LM-1H is an actuator which applies a vibration suppression force in the horizontal Y direction to the vibration damping table 13. The operation of the linear motor LM-1H as an actuator is the same as that of the linear motor LM-1V.

A position sensor PS-1V detects the vertical position of the vibration damping table 13. The position sensor PS-1V is used as a position detection means for holding the vibration damping table 13 at a predetermined position. A signal from the position sensor PS-1V is compared with a target position value, and then fed back to the air spring via an appropriate compensation means. The operation of the position feedback loop holds the vibration damping table 13 at a predetermined position. A position sensor PS-1H detects the position of the vibration damping table 13 in the horizontal Y direction. The operation of the position sensor PS-1H is the same as that of the position sensor PS-1V.

Elements with suffixes "-2V", "-3V", and "-4V" are elements which act in the vertical direction. Elements with suffixes "-2H", "-3H", and "-4H" are elements which act in the horizontal direction. Horizontal elements with "-1H" and "-3H" act in the Y direction, and horizontal elements with "-2H" and "-4H" act in the X direction.

The air springs SU and linear motors LM as actuators are arranged at the four corners of the vibration damping table 13. Each of the vibration sensor SN and position sensor PS is made up of only six elements with suffixes "-1V", "-1H", "-2V", "-2H", "-3V", and "-3H". The rigid-body motion of the vibration damping table 13 has six degrees of freedom, and at least six sensors are required to measure all the degrees of freedom of motion.

The arrangement of the feedback loop will be explained.

Figure 2:
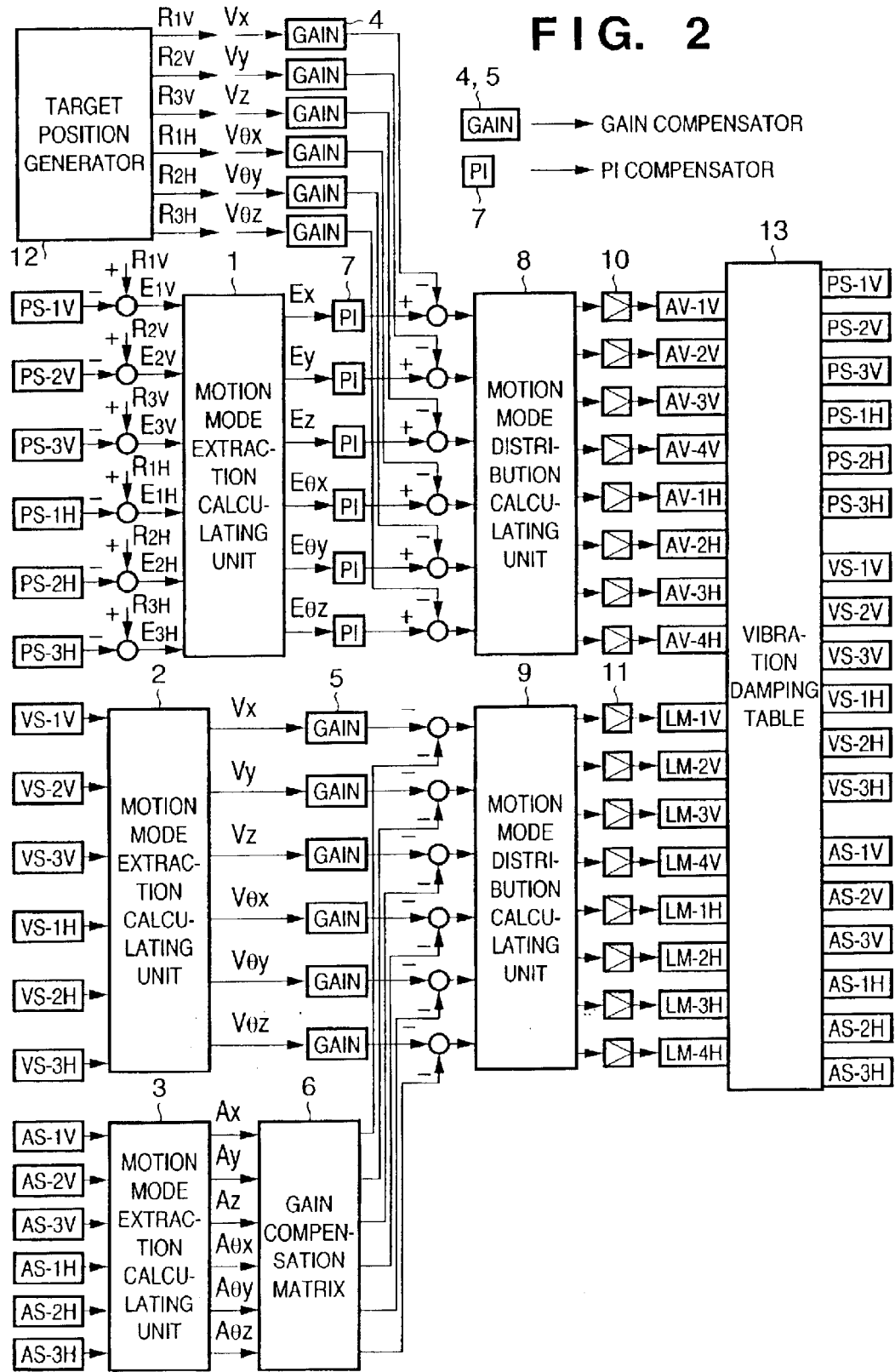
FIG. 2 is a block diagram showing the feedback loop of a controller which controls the vibration damping apparatus according to the embodiment of the present invention.

FIG. 2 is a block diagram showing the feedback loop of a controller which controls the vibration damping apparatus according to the embodiment of the present invention.

Considering the X-Y-Z coordinate system as a criterion, the rigid-body motion of the vibration damping table 13 is decomposed into a total of six motion modes: axial translations X, Y, and Z, and rotations $\theta x$, $\theta y$, and $\theta z$ about the respective axes. The feedback loop is constituted for each of the motion modes.

Position signals (PS-1V, PS-2V, PS-3V, PS-1H, PS-2H, and PS-3H) output from the position sensors PS are compared with predetermined target values (R1V, R2V, R3V, R1H, R2H, and R3H) output from a target position generator 12, and subtracted from them. The differences are converted into deviation signals (E1V, E2V, E3V, E1H, E2H, and E3H) regarding the respective position sensors. A motion mode extraction calculating unit 1 regarding the deviation is a calculation unit which converts the deviation signals into motion mode deviation signals (Ex, Ey, Ez, E$\theta$x, E$\theta$y, and E$\theta$z). Ex, Ey, and Ez are deviations in translations in the X-, Y-, and Z-axis directions, whereas E$\theta$x, E$\theta$y, and E$\theta$z are deviations in rotations about the X-, Y-, and Z-axes.

The vibration sensors SN-1V, SN-1H, SN-2V, SN-2H, SN-3V, and SN-3H output velocity signals and acceleration signals. Velocity signals (VS-1V, VS-1H, VS-2V, VS-2H, VS-3V, and VS-3H) output from the vibration sensors SN are converted into motion mode velocity signals (Vx, Vy, Vz, Vθx, Vθy, and Vθz) by a motion mode extraction calculating unit 2 regarding the velocity. Acceleration signals (AS-1V, AS-1H, AS-2V, AS-2H, AS-3V, and AS-3H) output from the vibration sensors SN are converted into motion mode acceleration signals (Ax, Ay, Az, Aθx, Aθy, and Aθz) by a motion mode extraction calculating unit 3 regarding the acceleration.

The feedback loop arrangement applies a motion mode vibration suppression force to the vibration damping table 13 after proper compensation is performed for a motion mode deviation signal, velocity signal, and acceleration signal.

A feedback loop which uses the air spring SU as an actuator will be explained.

The feedback loop which uses the air spring SU executes position control and realizes the skyhook stiffness. Deviation signals (Ex, Ey, Ez, Eθx, Eθy, and Eθz) are sent to PI compensators 7 for respective motion modes. P of PI means proportional operation, and I means integral operation. Proportional operation functions to improve mainly the response characteristic, and integral operation functions to eliminate a deviation signal. Position control is performed by the operation of the PI compensator 7 so as to eliminate a deviation signal. Accordingly, the vibration damping table 13 is held at a predetermined position. Gain compensators 4 regarding the stiffness function to receive velocity signals (Vx, Vy, Vz, Vθx, Vθy, and Vθz) and apply the skyhook stiffness for the respective motion modes. A motion mode distribution calculating unit 8 regarding the air spring SU converts the sum of a sign-inverted output from each gain compensator 4 and an output from a corresponding PI compensator 7 into a driving signal for the air valve AV. Power amplifiers 10 drive the air valves AV in accordance with outputs from the motion mode distribution calculating unit 8. The air valves AV control the internal pressures of the air springs SU. Vibration suppression forces generated by the air springs SU so act as to hold the vibration damping table 13 at a predetermined position and apply the skyhook stiffness. These elements constitute the feedback loop which uses the air spring SU as an actuator. Since the air spring SU has an integral characteristic, the skyhook stiffness is realized by causing the gain compensator 4 to act on a velocity signal and feeding back the resultant signal to the air spring SU.

A feedback loop which uses the linear motor LM will be explained. Gain compensators 5 regarding the viscosity function to receive velocity signals (Vx, Vy, Vz, Vθx, Vθy, and Vθz) and apply the skyhook viscosity for the respective motion modes. A gain compensation matrix 6 is a 6-input, 6-output gain matrix, and functions to receive acceleration signals (Ax, Ay, Az, Aθx, Aθy, and Aθz) and apply the inertia to the vibration damping table 13. "Application of the inertia" is an effect representing a dynamic behavior as if the inertia of the vibration damping table 13 increased. In the absence of any feedback loop, the inertia is determined by the mass, moment of inertia, and inertia product of the vibration damping table 13. A motion mode distribution calculating unit 9 regarding the linear motor converts the sum of a sign-inverted output from each gain compensator 5 and an output from the gain compensation matrix 6 into a driving signal for the linear motor LM. Power amplifiers 11 drive the linear motors LM in accordance with outputs from the motion mode distribution calculating unit 9. Vibration suppression forces generated by the linear motors LM so act as to apply the viscosity and inertia of the skyhook to the vibration damping table 13. These elements constitute the feedback loop which uses the linear motor LM as an actuator.

The gain compensators 4 regarding the stiffness and the gain compensators 5 regarding the viscosity act for six motion modes. The gain compensation matrix 6 is in a matrix format having a total of 36 elements for six inputs and six outputs. The present invention realizes proper inertia application so as to keep the natural mode of the rigid-body motion of the vibration damping table 13 unchanged by applying the stiffness and inertia of the skyhook. For this reason, the compensator which receives acceleration signals (Ax, Ay, Az, Aθx, Aθy, and Aθz) takes a matrix format. A design means for the gain compensation matrix 6 will be described in detail below using equations.

The natural mode of the rigid-body motion of the vibration damping table 13 will be explained.

The vibration damping table 13 is supported at four corners by stiffness elements such as the air spring SU. The rigid-body motion of the vibration damping table 13 includes a natural mode unique to a so-called rigid-body spring system. A natural mode which exists in the absence of any feedback will be described first. Then, changes in natural mode upon application of the skyhook stiffness will be described. As repetitively described above, the present invention prevents changes in natural mode by the inertia application effect.

Figure 3:
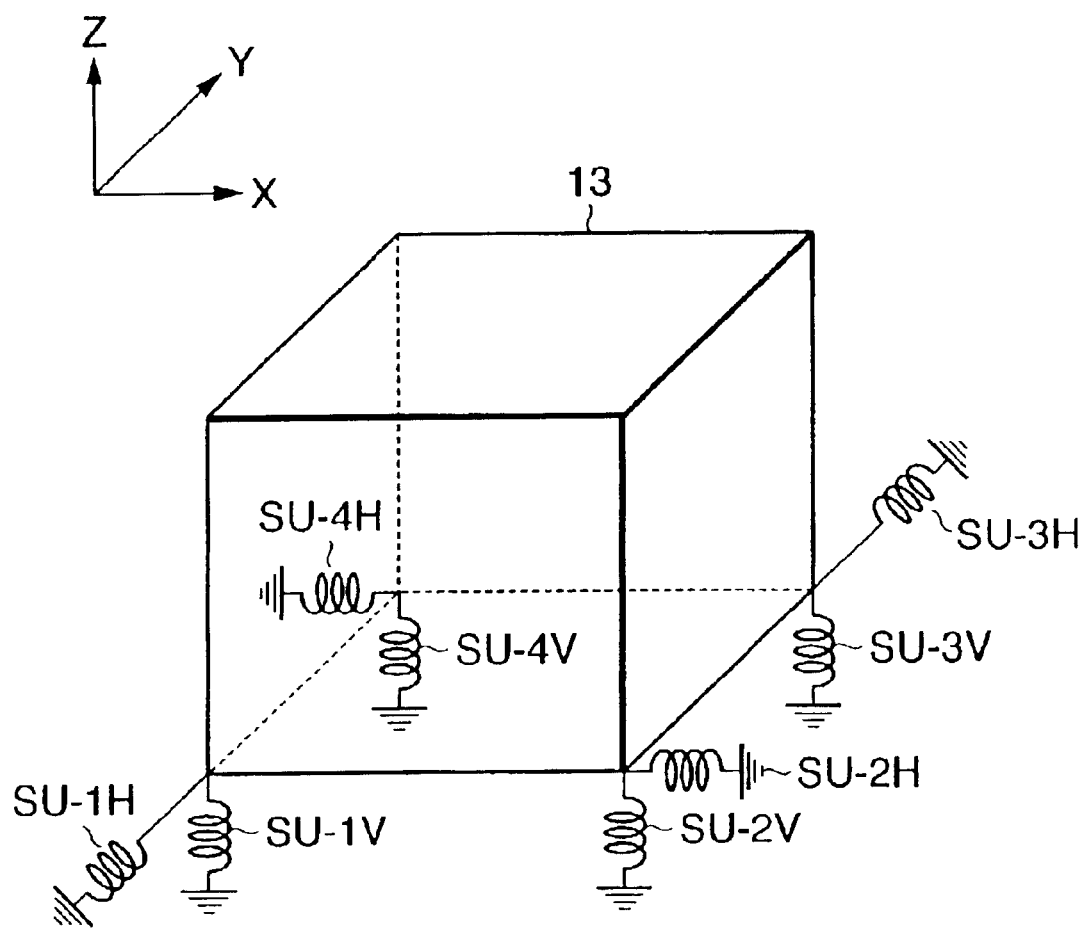
FIG. 3 is a diagram showing a rigid-body spring model.
Figure 4A:
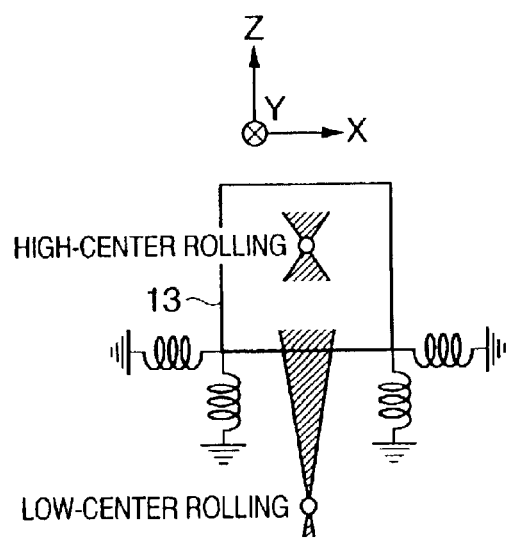
FIGS. 4A to 4D are diagrams each showing the mode shape of a natural mode.
Figure 4B:
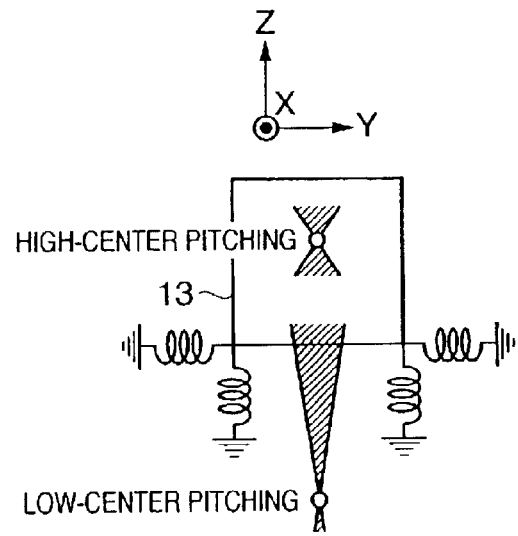
Figure 4C:
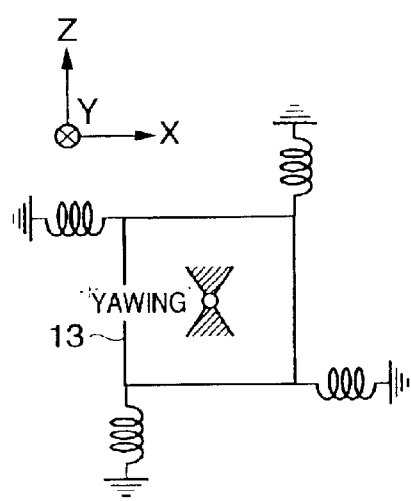
Figure 4D:
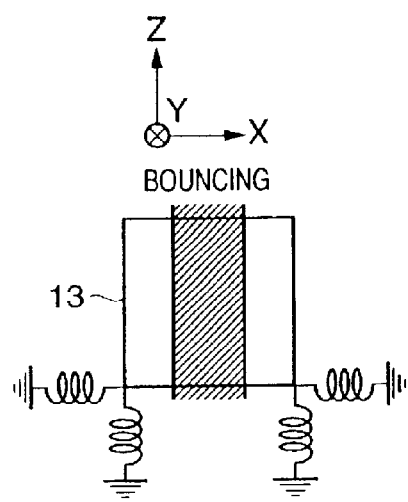

FIG. 3 shows the dynamic model of the vibration damping apparatus when no feedback is performed. The vibration damping table 13 is modeled into a stiffness element, and the air springs SU are modeled into stiffness elements which support the lower four corners of the vibration damping table 13. The vibration damping table 13 is supported by four stiffness elements: air springs SU-1V, SU-2V, SU-3V, and SU-4V in the vertical Z direction. The vibration damping table 13 is supported by two air springs SU-2H and SU-4H in the horizontal X direction and by two air springs SU-1H and SU-3H in the horizontal Y direction. The vibration sensors SN, position sensors PS, and linear motors LM are elements necessary to constitute the feedback loop, but are eliminated from the model of FIG. 3.

The motion equation of the vibration damping table 13 is $$Md^2X/dt^2 KX=0 \quad (2)$$

$$X=[x\ y\ z\ \theta x\ \theta y\ \mu z]^T \quad (3)$$

where X represents the displacement vector of a motion mode representing x, y, and z translation displacements and θx, θy, and θz rotational displacements, M is the inertia matrix, which is a constant matrix determined by the mass, moment of inertia, and inertia product of the vibration damping table 13, and K is the stiffness matrix, which is a constant matrix determined by the stiffness and layout of the air spring SU. The natural mode is determined by M and K. As is well known, the square root of the eigenvalue of a matrix $M^{-1}K$ is a natural frequency, and the eigenvector of the matrix $M^{-1}K$ corresponds to the mode shape.

As the mode shape of the model shown in FIG. 3, mode shapes shown in FIGS. 4A to 4D are well known. Two natural modes: low-center rolling and high-center rolling exist for the motion of the vibration damping table 13 within the X-Z plane. In general, high-center rolling has a rotation center inside the vibration damping table 13. When high-center rolling is displayed by a motion mode with X, Y, Z, θx, θy, and θz components, the θy component is dominant. In the feedback loop of the motion mode shown in FIG. 2, high-center rolling is observed and controlled as vibrations in the θy mode. Low-center rolling generally looks like vibrations of a so-called inverted pendulum whose rotation center is below the vibration damping table 13. For small amplitudes, low-center rolling is regarded as vibrations in X-axis translation. Hence, low-center rolling is observed and controlled as vibrations in the X mode.

For the motion within the Y-Z plane, natural modes of low-center pitching and high-center pitching exist, similar to the X-Z plane. In general, high-center pitching has a rotation center inside the vibration damping table 13, and low-center pitching has a rotation center below the vibration damping table 13. High-center pitching is observed and controlled as vibrations in the θx mode, while low-center pitching is observed and controlled as vibrations in the Y mode.

In the X-Y plane, yawing exists as rotation vibrations having a rotation center at almost the center inside the vibration damping table 13. Yawing is observed and controlled as vibrations in the θz mode. Furthermore, bouncing exists as a natural mode in Z-axis translation. Bouncing is observed and controlled as vibrations in the Z mode. The correspondence between the motion mode and the natural mode is as follows:

(1) X mode: low-center rolling
(2) Y mode: low-center pitching
(3) Z mode: bouncing
(4) θx mode: high-center pitching
(5) θy mode: high-center rolling
(6) θz mode: yawing.

When the components of one natural mode are displayed in accordance with their motion modes, they are not considered in one single motion mode. However, the main components are concentrated in one motion mode. For example, as is apparent from the mode shapes shown in FIGS. 4A to 4D, low-center rolling has the X mode and θy mode components in component display in the motion mode. The main component is the X mode, and low-center rolling can be substantially regarded as vibrations in the X mode. The motion mode feedback loop shown in FIG. 2 is established on the structure in which each motion mode is the main component of a corresponding natural mode.

Figure 6:
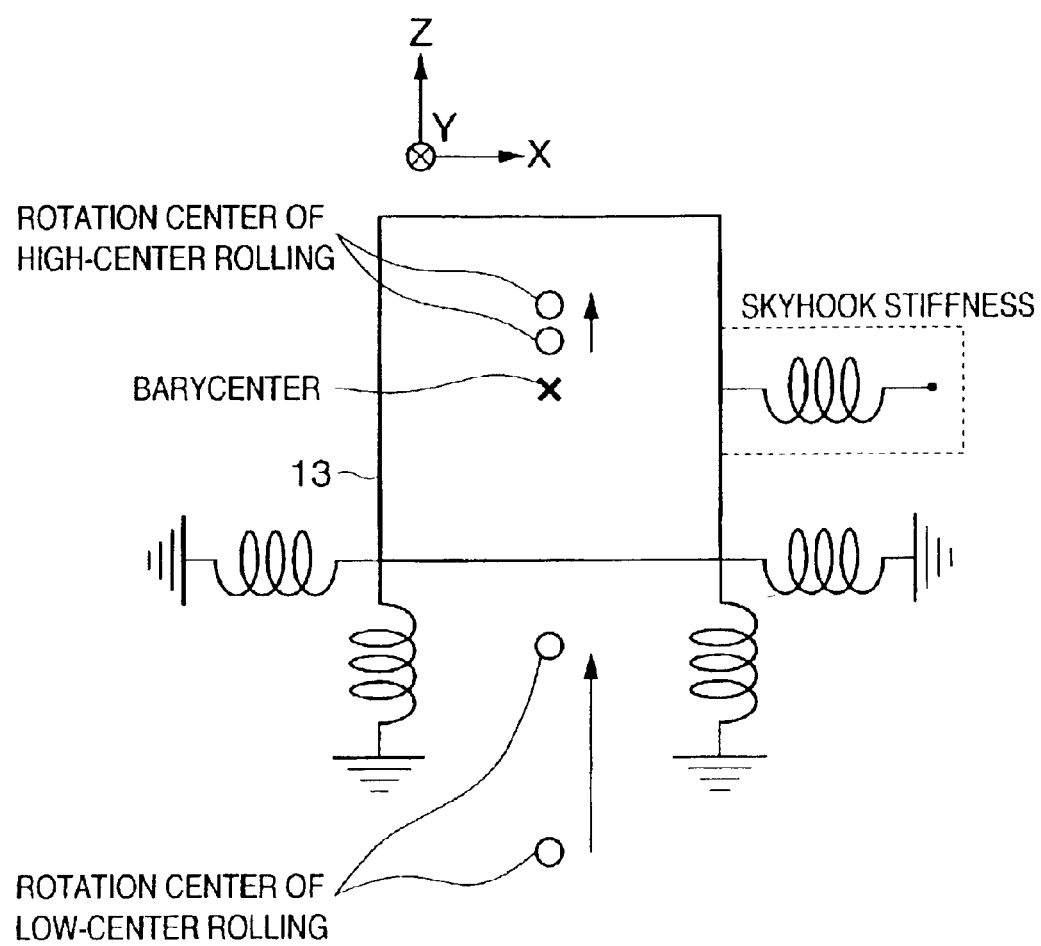
FIG. 6 is a view showing changes in mode shape by application of the skyhook stiffness.

Application of the skyhook stiffness is considered to greatly contribute to improving the vibration suppression/vibration damping performance of the vibration damping apparatus. However, simple stiffness application may inhibit the operation of the vibration damping apparatus because of changes in natural mode. FIG. 6 directly shows changes in natural mode when the skyhook stiffness is applied to the vibration damping table 13 by feedback loop operation.

FIG. 6 shows changes in natural mode when the stiffness is applied in the X translation direction by the feedback loop. A stiffness element applied at the level of the barycenter on the right side of the vibration damping table 13 is the skyhook stiffness. By applying the skyhook stiffness, the rotation centers of low-center rolling and high-center rolling move up.

Changes in natural mode cause various problems in the vibration damping apparatus. First, the feedback loop of each motion mode fails. As is apparent from FIG. 6, the rotation center of high-center rolling moves up from the barycenter. Then, a loop arrangement in which high-center rolling is controlled by the feedback loop of the θy mode is disturbed. This also applies to low-center rolling. If the rotation center of low-center rolling is at a level much lower than the vibration damping table 13, the natural mode can be regarded as X translation vibrations. If, however, the rotation center comes close to the vibration damping table 13 due to stiffness application, as shown in FIG. 6, low center rolling cannot be regarded as X translation vibrations, and becomes rotation motion whose rotation center is below the barycenter. It becomes difficult to apply damping to vibrations of low-center rolling and to control the position by the feedback loop of the X mode.

Accordingly, feedback loop operation cannot be achieved properly. The natural mode is a basic design specification for a mechanical structure such as a vibration damping apparatus. The movable direction and range of a movable mechanism are designed based on the natural mode. This also applies to the layout of a vibration sensor and an actuator, and their layout is determined in consideration of the observability and controllability of the natural mode. If the natural mode changes, the movable mechanism and the layout of the vibration sensor and actuator must be designed again. In other words, the mechanical structure must be designed and fabricated again.

Also, the performance evaluation of the vibration damping apparatus cannot be performed accurately. The floor vibration transmissibility, which is one of indices for the performance evaluation of the vibration damping apparatus, is generally measured in two horizontal directions and the vertical direction. Measurement is done by installing vibration sensors on both the vibration damping table and installation floor. If, however, the natural mode in X translation disappears upon stiffness application, as shown in FIG. 6, the floor vibration transmissibility in the X direction cannot be measured at a high precision. Vibrations excited in the vibration damping table 13 are vibrations in the natural mode, and measurement becomes invalid in the absence of the X translation vibration component.

For these reasons, changes in natural mode even upon applying the skyhook stiffness must be prevented. A means for this purpose is to apply the inertia by the feedback loop, which is the gist of the present invention. The block diagram of the feedback loop according to the present invention is shown in FIG. 2. The inertia application loop comprises the gain compensation matrix 6, which is a feature of the present invention. A method of designing the gain compensation matrix 6 will be explained.

Letting M be the inertia matrix, and K be the stiffness matrix, the natural mode is given by the matrix $M^{-1}K$ in a state free from any feedback, as represented by equations (2) and (3) above. The natural frequency is the square root of the eigenvalue of the matrix $M^{-1}K$, and the mode shape is the eigenvector of this matrix. Inertia application by the feedback loop changes the inertia matrix from M to M+M'. Stiffness application by the feedback loop changes the stiffness matrix from K to K+K'. Then, the motion equation is $$(M+M')d^2X/dt^2+(K+K')X=0 \qquad (4)$$

$$X=[xyz\theta x\theta y\theta z]^T \qquad (5)$$

The natural mode is determined by a matrix $(M+M')^{-1}(K+K')$. The following equation suffices to be established for keeping the natural mode unchanged regardless of the presence/absence of the feedback loop:

$$(M+M')^{-1}(K+K')=M^{-1}K \qquad (6)$$

From equation (6), the natural mode can be kept unchanged as long as M' representing the inertia by the feedback loop satisfies $$M'=\{(K+K')K^{-1}-I\}M \qquad (7)$$

where I is the unit matrix of order 6, and M and K are known constant matrices determined by the physical parameters of the vibration damping apparatus. The physical parameters are the mass, moment of inertia, and inertia product of the vibration damping table 13, and the stiffness of the air spring SU. K' is determined by the loop gain of the stiffness application feedback loop, and is also a known matrix. Since M, K, and K' are known matrices, M' which keeps the natural mode unchanged is determined by equation (7). The gain compensation matrix 6 is so designed as to realize M'.

In the block diagram of the feedback loop shown in FIG. 2, the gain compensators 4 having the stiffness application function are arranged for respective motion modes. Because of a loop arrangement in which motion modes do not interfere with each other, K' is a diagonal matrix. However, M' determined by equation (7) does not generally become a diagonal matrix. The inertia application loop contains interference between motion modes. For this reason, the inertia application loop adopts the gain compensation matrix 6 in FIG. 2. The gain compensation matrix 6 is not always a diagonal matrix. If M' becomes a diagonal matrix, the inertia application loop also performs gain compensation for each motion mode such that the stiffness and viscosity application loops have the gain compensators 4 and 5 for each motion mode.

The feedback loop for applying the inertia according to the embodiment is so designed as to satisfy equation (7). This can keep the natural mode unchanged. The unchanged natural mode means that the natural frequency and mode shape are also unchanged. Hence, a feedback loop for each motion mode operates appropriately to preferably execute position control of holding the position of the vibration damping table 13 constant and viscosity application for vibration damping. Since the natural mode as the basic specification of the vibration damping apparatus is kept unchanged, the mechanical structure of the vibration damping apparatus operates preferably with the original design. That is, design indices such as the movable range and movable direction of the movable mechanism, the vibration sensor layout considering the observability, and the actuator layout considering the controllability remain unchanged regardless of the presence/absence of the feedback loop.

The natural mode is determined by the matrix $(M+M')^{-1}(K+K')$, and the natural mode can be arbitrarily adjusted by setting M'. If the gain compensation matrix 6 is so designed as to realize M', the natural mode can be arbitrarily adjusted.

Figure 8:
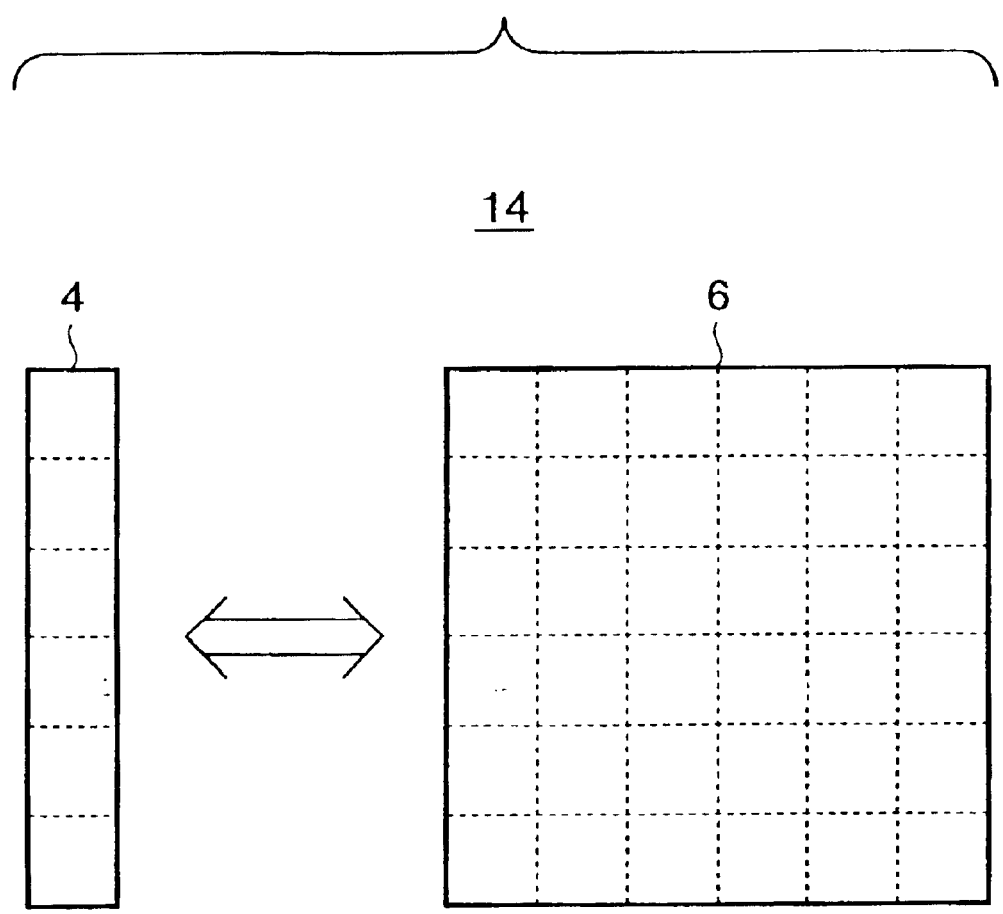
FIG. 8 is a view showing the correspondence table between the stiffness and the inertia.

Equation (7) is an arithmetic matrix expression and requires a large amount of calculation. It is desirable for actually operating the feedback loop to calculate the correspondence between M' and K' in advance and hold the result in a table. In other words, as shown in FIG. 8, a table 14 holds the correspondence between the gain compensator 4 which applies the stiffness and the gain compensation matrix 6 which applies the inertia. When the feedback loop operates actually, the values of the gain compensator 4 and gain compensation matrix 6 are determined in accordance with the table 14. In FIG. 8, the gain compensator 4 is represented by six elements in correspondence with the motion modes x, y, z, θx, θy, and θz. The gain compensation matrix 6 is represented as a square matrix having 36 elements. Preparing the table 14 in advance enables quickly determining the values of the gain compensator 4 and gain compensation matrix 6 without any enormous calculation like equation (7).

As shown in FIG. 1, this embodiment discloses a vibration damping apparatus in which the air springs SU support the four corners of the vibration damping table 13 and the eight linear motors LM and six vibration sensors SN are arranged. The present invention is not limited to this application range. The gist of the present invention that the stiffness of the skyhook and the inertia are applied to the vibration damping table 13 by the feedback loop while the natural mode is kept unchanged can be achieved regardless of the shape of the vibration damping table and the types of vibration sensor and actuator. An exposure apparatus having the vibration damping apparatus according to the present invention can be implemented regardless of whether the exposure method is sequential exposure or scanning exposure.

[Exposure Apparatus]

Figure 9:
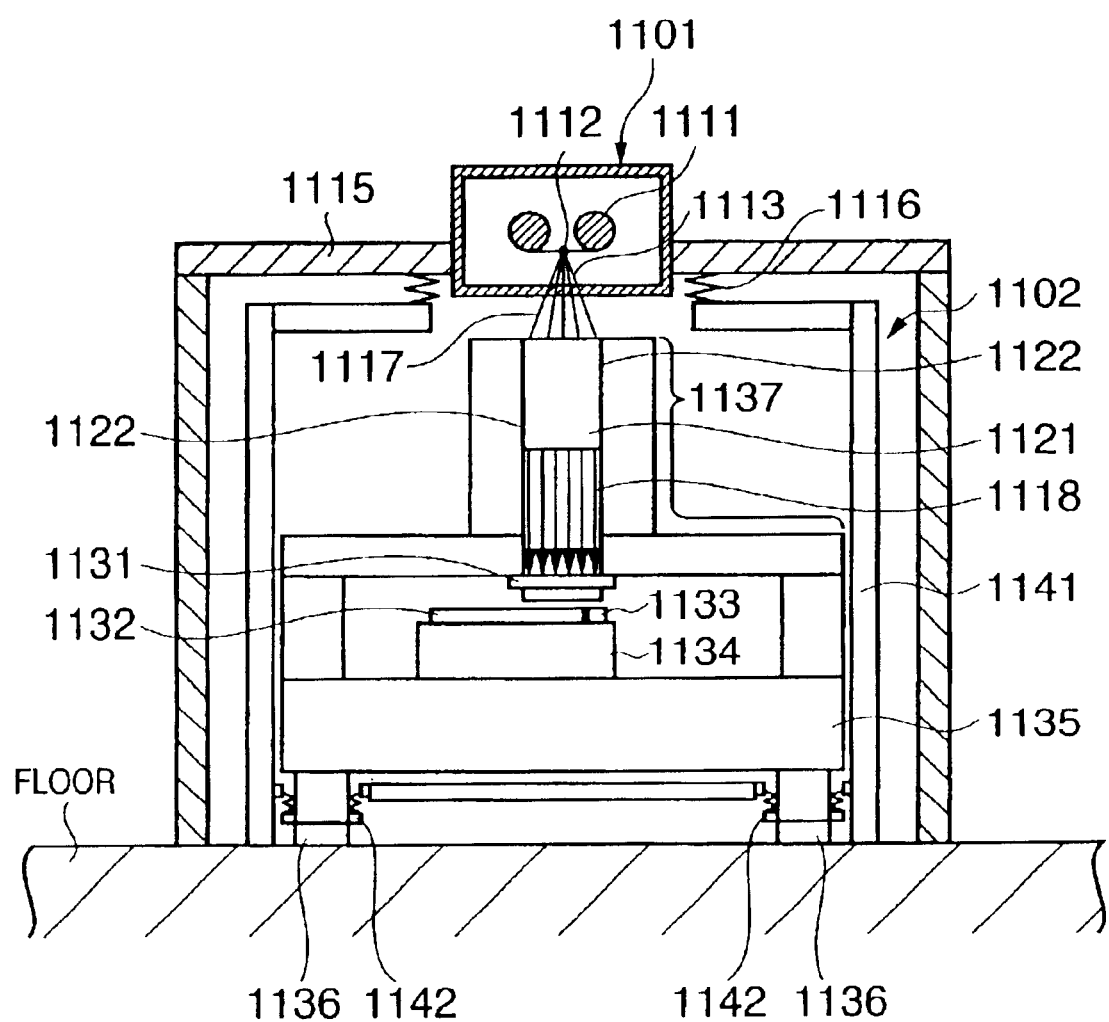
FIG. 9 is a view showing the schematic arrangement of an X-ray exposure apparatus according to the embodiment.

FIG. 9 shows the schematic arrangement of an X-ray exposure apparatus according to the embodiment. Numeral 1101 denotes an X-ray source unit which generates X-rays. The interior of the X-ray source unit 1101 is kept at a vacuum. The X-rays source unit 1101 generates X-rays 1117 by irradiating a target 1111 by a laser (not shown) and generating a plasma. The X-rays 1117 globally diverge from a light source 1112, and some of them are sent to a reduced pressure He chamber 1141 via an X-ray extraction window 1113. The reduced-pressure chamber 1141 incorporates a collimator 1121, which collimates diverging incident X-rays and sends them at the view angle of exposure (numeral 1118). The X-rays 1117 generated by the light source 1112 are divergent light, and its intensity decreases at an exposure position apart from the light source in inverse proportion to the distance. To prevent this, it is also one of the roles of the collimator to receive a larger amount of X-rays and to increase the X-ray intensity for exposure.

A mask 1131 bears a transfer pattern formed on a membrane (not shown). A wafer 1132 coated with a photosensitive agent at a position slightly apart from the membrane by about 10 μm is aligned by an alignment apparatus (not shown), and irradiated with the X-rays 1118 emerging from the collimator 1121, transferring the pattern. The wafer 1132 is sequentially moved step by step by a wafer stage 1134, and sequentially exposed.

The exposure apparatus is mainly constituted by the X-ray source unit 1101 and a main body 1102. The X-ray source unit 1101 is mounted in a light source unit frame 1115, and set on the floor independently of the main body 1102. This structure prevents a decrease in alignment precision between the mask 1131 and the wafer 1132 caused by transferring heat generated from the light source to the frame and thermally distorting the main body 1102. In addition, installation of the apparatus can be facilitated by supporting the X-ray source unit and main body 1102 by separate structures.

The X-ray source unit 1101 incorporates the target 1111, which is irradiated by the laser (not shown), to generate a plasma and to generate X-rays 1117. The interior of the X-ray source unit is in a vacuum and is isolated from the reduced-pressure He atmosphere of the main body 1107 by the X-ray extraction window 1113 made of Be with a thickness of several μm. This prevents deterioration of the vacuum atmosphere. Since Be exhibits a high X-ray transmittance but He does not transmit X-rays, Be is used for an X-ray extraction window. A bellows A (numeral 1116) is interposed between the X-ray source unit 1101 and the reduced-pressure He chamber 1141, and isolates the exposure apparatus from the outside.

The main body 1102 is housed in the reduced-pressure He chamber 1141, and entirely held in a reduced-pressure He atmosphere by an He atmosphere generation apparatus (not shown). By using reduced-pressure He for an atmosphere through which X-rays as exposure light pass, attenuation of X-rays can be suppressed to be small. The main body 1102 is constituted by the collimator 1121 of the illumination optical system, a mask stage (not shown), which holds and aligns the mask 1131, the wafer stage 1134 which holds, aligns, and drives step by step the wafer 1132, a transfer system (not shown), which transfers the mask 1131 and wafer 1132, and a measurement system (not shown), which transfers the mask 1131 and wafer 1132, and a measurement system (not shown), which measures the positions of the mask 1131 and wafer 1132. The main body 1102 is set on the floor via a vibration damping apparatus 1136. A stage surface plate 1135 is set on the vibration damping apparatus 1136, and the wafer stage 1134 moves on the stage surface plate 1135. A main body frame 1137 is set on the stage surface plate 1135, and the collimator 1121 is fixed to the main body frame 1137. The collimator 1121 is assembled with its position and posture adjusted in assembly adjustment so as to attain a uniform intensity distribution on the mask plane and make the exposure X-rays 1118 be perpendicularly incident on the mask.

The vibration damping apparatus 1136 prevents a decrease, by vibrations from the floor, in alignment precision between the mask 1131 and the wafer 1132 which must be precisely aligned. Also, the vibration damping apparatus 1136 keeps the posture of the main body 1102 constant. The vibration damping apparatus 1136 is formed from air springs, and it is difficult to remove low-frequency vibrations (vibrations of several Hz or less).

A bellows B (numeral 1142) is interposed between the reduced-pressure He chamber 1141 and the main body 1102 so as not to deteriorate the reduced-pressure He atmosphere even if the posture of the main body 1102 changes.

(Embodiment of a Semiconductor Production System)

Next, an example of a semiconductor device (e.g., a semiconductor chip of IC, LSI or the like, a liquid crystal panel, a CCD, a thin film magnetic head, a micromachine, etc.) production system using the apparatus of the present invention will be described. The system performs maintenance services such as trouble shooting, periodical maintenance or software delivery for fabrication apparatuses installed in a semiconductor manufacturing factory, by utilizing a computer network outside the fabrication factory.

Figure 10:
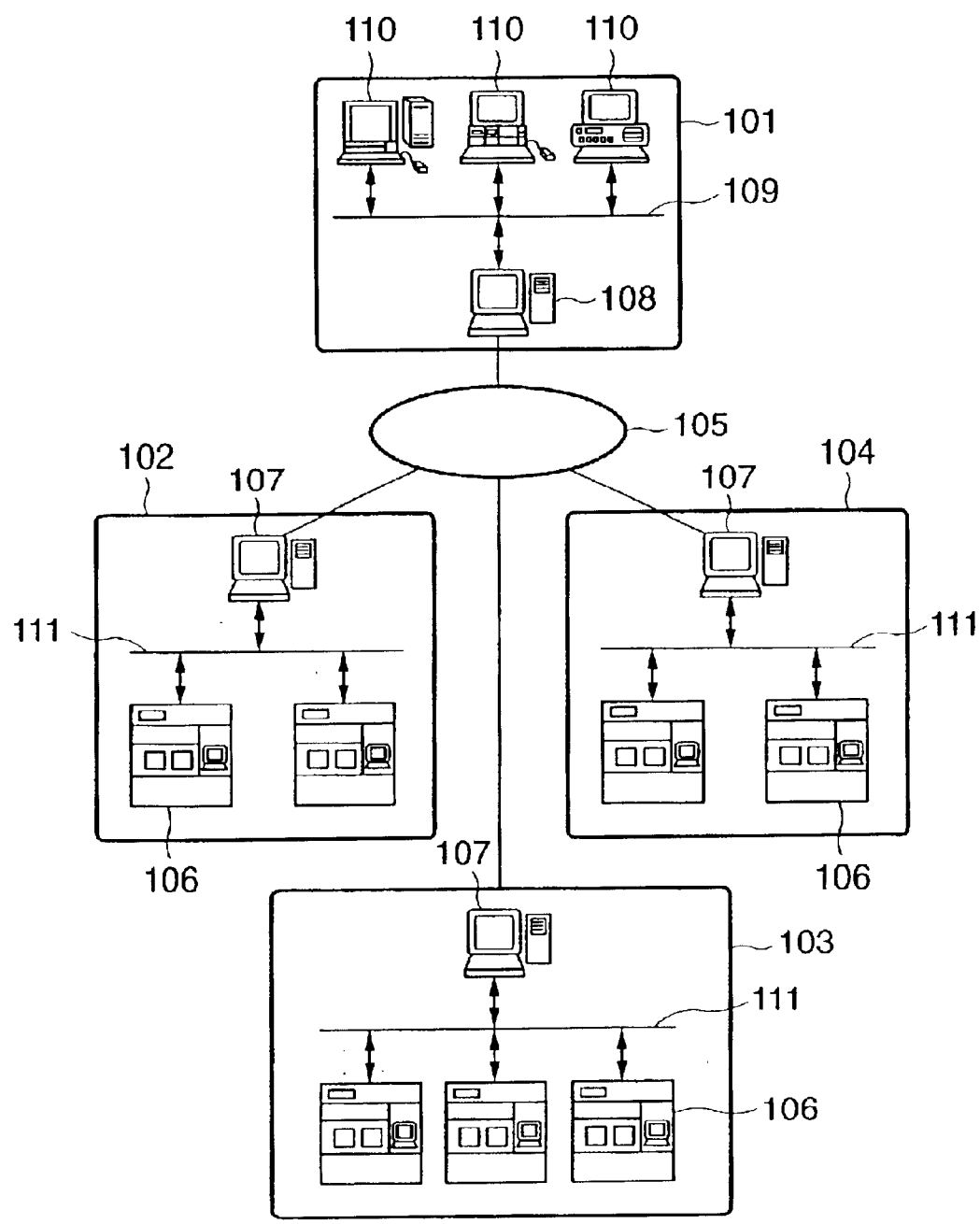
FIG. 10 is a conceptual diagram of a semiconductor device production system using the apparatus according to the embodiment, viewed from an angle.

FIG. 10 shows the entire system cut out from an angle. In the figure, numeral 101 denotes the office of a vendor (apparatus maker) of semiconductor device fabrication apparatuses. As the semiconductor fabrication apparatuses, apparatuses in the semiconductor fabrication factory for performing various processes, such as preprocess apparatuses (e.g., lithography apparatuses including an exposure apparatus, a resist processing apparatus and an etching apparatus, a heat processing apparatus, a film forming apparatus, a smoothing apparatus and the like) and postprocess apparatuses (e.g., an assembly apparatus, an inspection apparatus and the like), are used. The office 101 has a host management system 108 to provide a maintenance database for the fabrication apparatus, plural operation terminal computers 110, and a local area network (LAN) 109 connecting them to construct an Intranet or the like. The host management system 108 has a gateway for connection between the LAN 109 and the Internet 105 as an external network and a security function to limit access from the outside.

On the other hand, numerals 102 to 104 denote fabrication factories of semiconductor makers as users of the fabrication apparatuses. The fabrication factories 102 to 104 may belong to different makers or may belong to the same maker (e.g., preprocess factories and postprocess factories). The respective factories 102 to 104 are provided with plural fabrication apparatuses 106, a local area network (LAN) 111 connecting the apparatuses to construct an Intranet, or the like, and a host management system 107 as a monitoring apparatus to monitor operating statuses of the respective fabrication apparatuses 106. The host management system 107 provided in the respective factories 102 to 104 has a gateway for connection between the LAN 111 and the Internet 105 as the external network. In this arrangement, the host management system 108 on the vendor side can be accessed from the LAN 111 in the respective factories via the Internet 105, and only limited user(s) can access the system by the security function of the host management system 108. More particularly, status information indicating the operating statuses of the respective fabrication apparatuses 106 (e.g., a problem of a fabrication apparatus having trouble) is notified from the factory side to the vendor side via the Internet 105, and maintenance information such as response information to the notification (e.g., information indicating a measure against the trouble, or remedy software or data), latest software, help information, and the like, is received from the vendor side via the Internet. The data communication between the respective factories 102 to 104 and the vendor 101 and data communication in the LAN 111 of the respective factories are performed by using a general communication protocol (TCP/IP). Note that as the external network, a private-line network (e.g., an ISDN or the like) with high security against access from outsiders may be used in place of the Internet.

Further, the host management system is not limited to that provided by the vendor, but a database constructed by the user may be provided on the external network, to provide the plural user factories with access to the database.

Figure 11:
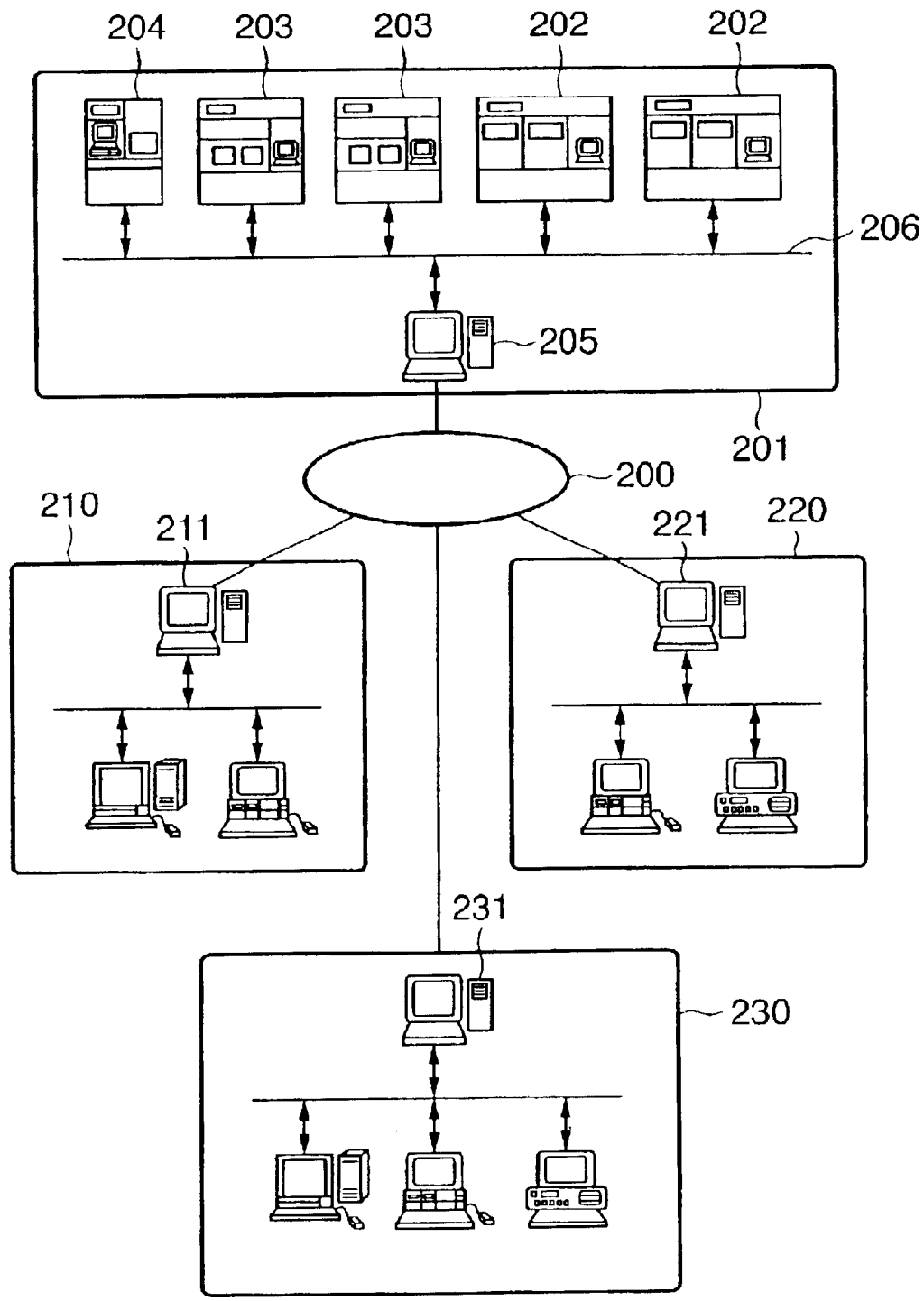
FIG. 11 is a conceptual diagram of the semiconductor device production system using the apparatus according to the embodiment, viewed from another angle.

FIG. 11 is a conceptual diagram showing the entire system of the present embodiment cut out from another angle different from that in FIG. 10. In the above example, the plural user factories respectively having fabrication apparatuses and the management system of the apparatus vendor are connected via the external network, and data communication is performed for production management for the respective factories and transmission of information on at least one fabrication apparatus. In this example, a factory having fabrication apparatuses of plural vendors is connected with management systems of the respective vendors of the fabrication apparatuses via the external network, and data communication is performed for transmission of maintenance information for the respective fabrication apparatuses. In the figure, numeral 201 denotes a fabrication factory of a fabrication apparatus user (e.g., a semiconductor device maker). In the factory fabrication line, fabrication apparatuses for performing various processes, an exposure apparatus 202, a resist processing apparatus 203 and a film forming apparatus 204, are used. Note that FIG. 11 shows only the fabrication factory 201, however, actually, plural factories construct the network. The respective apparatuses of the factory are connected with each other by a LAN 206 to construct an Intranet, and a host management system 205 performs operation management of the fabrication line.

On the other hand, the respective offices of vendors (apparatus makers), an exposure apparatus maker 210, a resist processing apparatus maker 220, and a film forming apparatus maker 230 have host management systems 211, 221 and 231 for remote maintenance for the apparatuses, and as described above, the systems have the maintenance database and the gateway for connection to the external network. The host management system 205 for management of the respective apparatuses in the user fabrication factory is connected with the respective vendor management systems 211, 221 and 231 via the Internet or private-line network as an external network 200. In this system, if one of the fabrication apparatuses of the fabrication line has trouble, the operation of the fabrication line is stopped. However, the trouble can be quickly removed by receiving the remote maintenance service from the vendor of the apparatus via the Internet 200, thus the stoppage of the fabrication line can be minimized.

The respective fabrication apparatuses installed in the semiconductor fabrication factory have a display, a network interface and a computer to execute network access software stored in a memory and device operation software. As a memory, an internal memory, a hard disk or a network file server may be used. The network access software, including a specialized or general web browser, provides a user interface screen image as shown in FIG. 12 on the display. An operator who manages the fabrication apparatuses in the factory checks the screen image and inputs information of the fabrication apparatus, a model 401, a serial number 402, a trouble case name 403, a date of occurrence of trouble 404, an emergency level 405, a problem 406, a remedy 407 and a progress 408, into input fields on the screen image. The input information is transmitted to the maintenance database via the Internet, and appropriate maintenance information as a result is returned from the maintenance database and provided on the display. Further, the user interface provided by the web browser realizes hyper link functions 410 to 412 as shown in the figure, and the operator accesses more detailed information of the respective items, downloads latest version software to be used in the fabrication apparatus from a software library presented by the vendor, and downloads operation guidance (help information) for the operator's reference. The maintenance information provided from the maintenance database includes the information on the above-described present invention, and the software library provides latest version software to realize the present invention.

Figure 13:
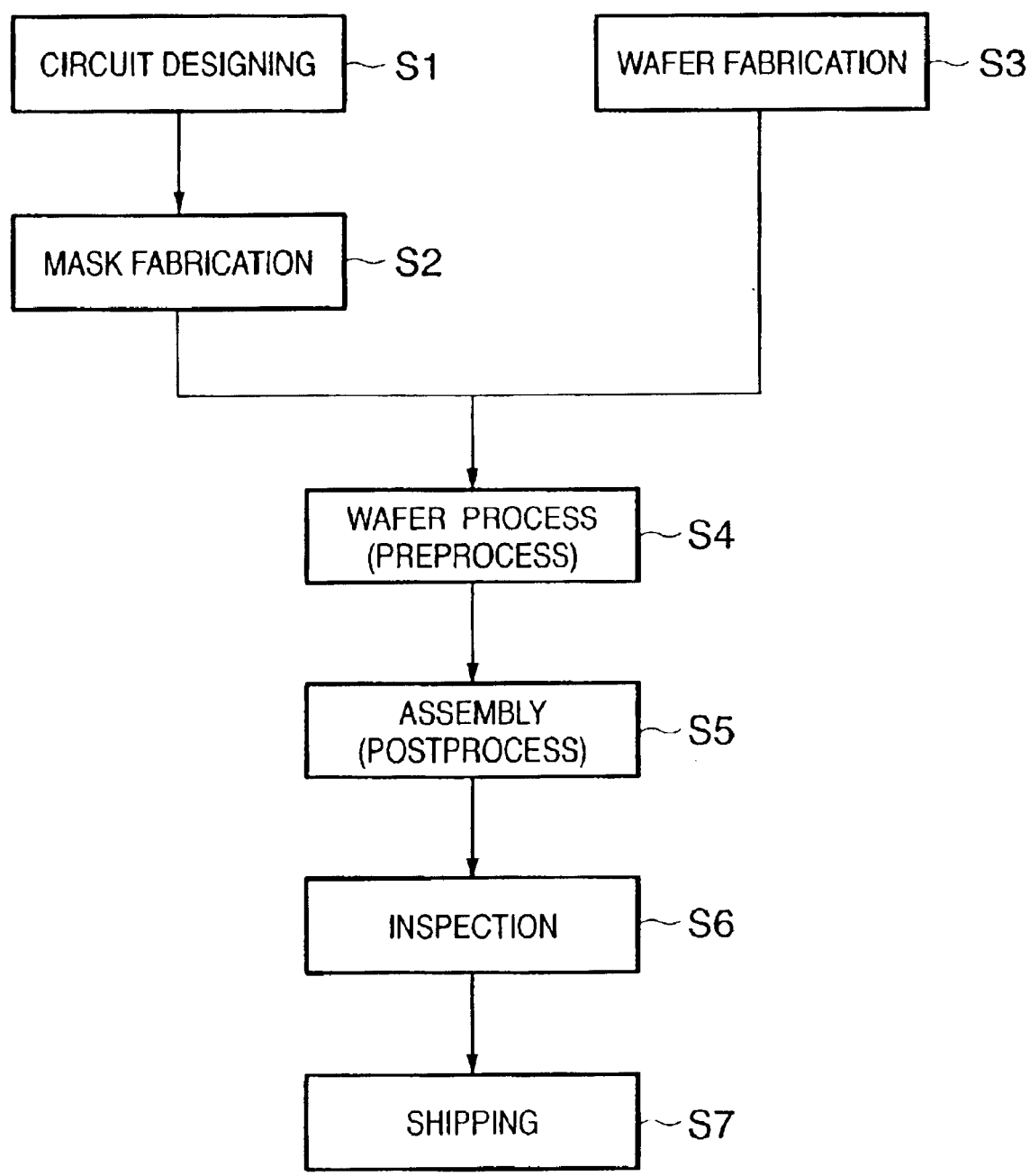
FIG. 13 is a flowchart showing device fabrication process.

Next, a semiconductor device fabrication process utilizing the above-described production system will be described. FIG. 13 shows a flow of the entire semiconductor fabrication process. At step S1 (circuit designing), a circuit designing of the semiconductor device is performed. At step S2 (mask fabrication), a mask where the designed circuit pattern is formed is fabricated. On the other hand, at step S3 (wafer fabrication), a wafer is fabricated using silicon or the like. At step S4 (wafer process), called a preprocess, the above mask and wafer are used. An actual circuit is formed on the wafer by lithography. At step S5 (assembly), called a postprocess, a semiconductor chip is formed by using the wafer at step S4. The postprocess includes processing such as an assembly process (dicing and bonding) and a packaging process (chip sealing). At step S6 (inspection), inspections such as an operation test and a durability test are performed on the semiconductor device assembled at step S5. The semiconductor device is completed through these processes, and it is shipped (step S7). The preprocess and the postprocess are independently performed in specialized factories, and maintenance is made for these factories by the above-described remote maintenance system. Further, data communication is performed for production management and/or apparatus maintenance between the preprocess factory and the postprocess factory via the Internet or private-line network.

Figure 14:
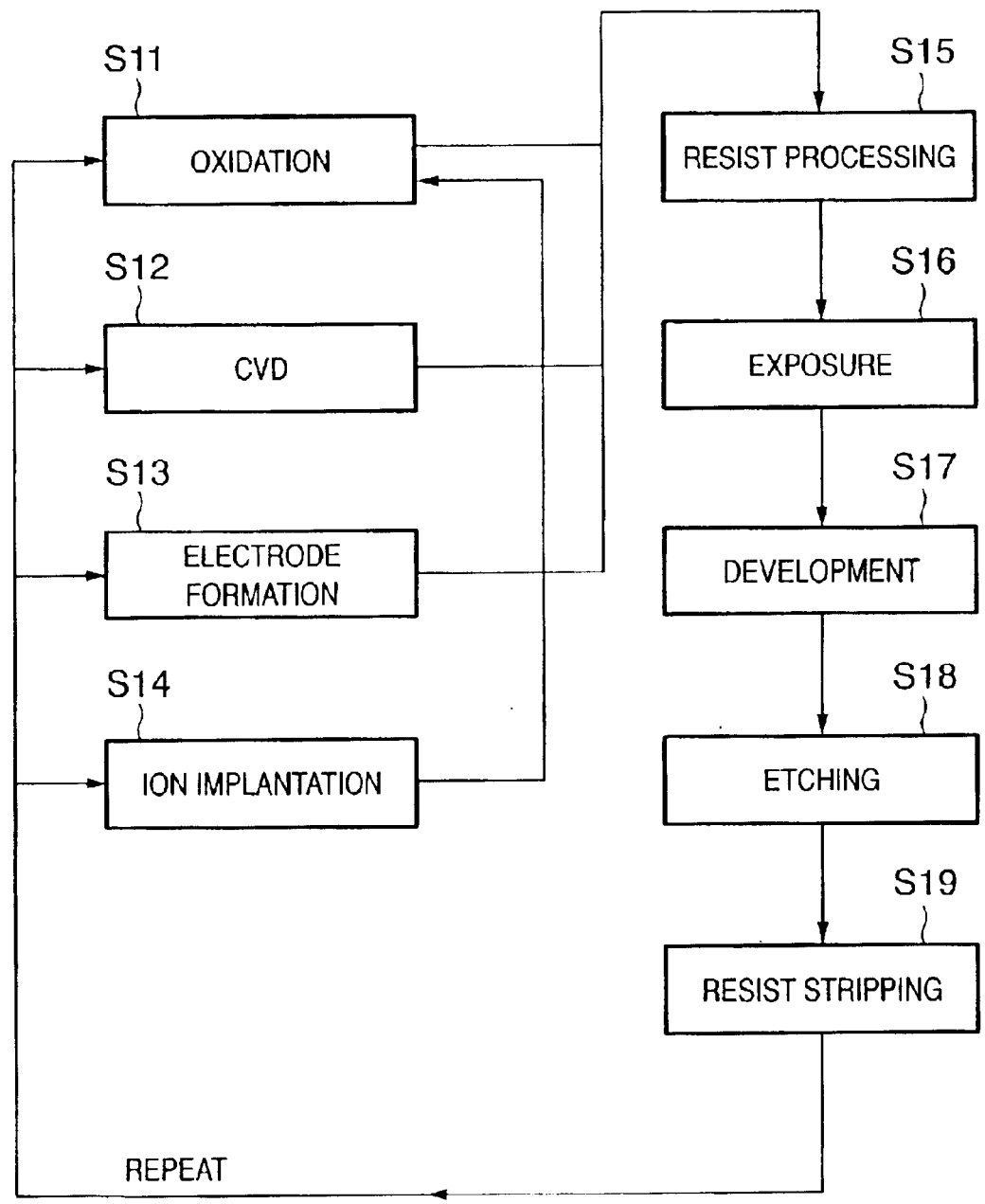
FIG. 14 is a flowchart showing a wafer process.

FIG. 14 shows a more detailed flow of the wafer process. At step S11 (oxidation), the surface of the wafer is oxidized. At step S12 (CVD), an insulating film is formed on the surface of the wafer. At step S13 (electrode formation), electrodes are formed by vapor deposition on the wafer. At step S14 (ion implantation), ions are injected into the wafer. At step S15 (resist processing), the wafer is coated with photoresist. At step S16 (exposure), the above-described exposure apparatus exposure-transfers the circuit pattern of the mask onto the wafer. At step S17 (development), the exposed wafer is developed. At step S18 (etching), portions other than the resist image are etched. At step S19 (resist stripping), the resist unnecessary after the etching is removed. These steps are repeated, thereby multiple circuit patterns are formed on the wafer. As maintenance is performed on the fabrication apparatuses used in the respective steps by the above-described remote maintenance system, trouble is prevented, and even if it occurs, quick recovery can be made. In comparison with the conventional art, the productivity of the semiconductor device can be improved.

The above embodiment can execute forced exposure in the presence of a wafer flatness defect due to a process factor. In etching, the influence on peripheral shots exposed normally can be minimized, increasing the wafer yield.

The above embodiment comprises a function of storing for a plurality of wafers a location where a focus control error has occurred due to a wafer flatness defect traced back to a chuck factor. In addition to the above effect, the contamination of the wafer chuck can be quickly detected.

The above embodiment comprises a function of stopping and retrying exposure upon occurrence of a focus control error under the influence of disturbance from the floor or the like as long as the process has not progressed to scanning exposure. The defective exposure shot ratio can be decreased, increasing the yield.

The above embodiment comprises a function of automatically determining retry or forced exposure. The time during which the apparatus stops and waits for operator determination can be minimized, increasing the apparatus availability.

OTHER EMBODIMENT

The present invention includes a case wherein the object of the present invention can also be achieved by providing a software program for performing a control method for the vibration damping apparatus according to an embodiment to a system or an apparatus from a remote position, and reading and executing the program code with a computer of the system or apparatus. In such a case, the form of the software is not necessarily a program as long as it has a function of a program.

Accordingly, to realize the functional processing of the present invention by the computer, the program code itself installed in the computer realizes the present invention. That is, the claims of the present invention include a computer program itself to realize the functional processing of the present invention.

In such a case, other forms of programs may be used, such as a program executed by object code, an interpreter and the like, or script data to be supplied to an OS (Operating System), as long as it has the function of a program.

As a storage medium for providing the program, a floppy disk, a hard disk, an optical disk, a magneto-optical disk, an MO, a CD-ROM, a CD-R, a CD-RW, a magnetic tape, a non-volatile type memory card, a ROM, a DVD (a DVD-ROM and a DVD-R) or the like can be used.

Further, the program may be provided by accessing a home page on the Internet by using a browser of a client computer, and downloading the computer program itself of the present invention or a compressed file having an automatic installation function from the home page to a storage medium such as a hard disk. Further, the present invention can be realized by dividing a program code constructing the program of the present invention into plural files, and downloading the respective files from different home pages. That is, the claims of the present invention also include an internet server holding the program file to realize the functional processing of the present invention to be downloaded to plural users.

Further, the functional processing of the present invention can be realized by encrypting the program of the present invention and storing the encrypted program into a storage medium such as a CD-ROM, delivering the storage medium to users, permitting a user who satisfied a predetermined condition to download key information for decryption from the home page via the Internet, and the user's executing the program by using the key information and installing the program into the computer.

Furthermore, besides the functions according to the above embodiments are realized by executing the read program by a computer, the present invention includes a case where an OS or the like working on the computer performs a part or entire actual processing in accordance with designations of the program code and realizes functions according to the above embodiments.

Furthermore, the present invention also includes a case wherein, after the program code read from the storage medium is written in a function expansion board, which is inserted into the computer or in a memory provided in a function expansion unit, which is connected to the computer, CPU, or the like, contained in the function expansion board or unit, performs a part of or an entire process in accordance with designations of the program code and realizes functions of the above embodiments.

The present invention is not limited to the above embodiments and various changes and modifications can be made within the spirit and scope of the present invention. Therefore, to apprise the public of the scope of the invention, the following claims are made.

What is claimed is:

1. An anti-vibration apparatus comprising:
    a table;
    an actuator system which applies a force to said table;
    a first system which applies to said actuator system a first signal for causing said actuator system to apply the force in proportion to a displacement of said table; and
    a second system which applies to said actuator system a second signal for causing said actuator system to apply the force based on an acceleration of said table,
    wherein the first and second signals are generated by said first and second systems, respectively, so that a natural vibration mode of a system including said table and said actuator system is unchanged.

2. An apparatus according to claim 1, wherein said actuator system includes an air spring actuator, and said first system applies the first signal to said air spring actuator.

3. An apparatus according to claim 2, wherein said first system generates the first signal in proportion to a velocity of said table.

4. An apparatus according to claim 1, wherein said actuator system includes a motor, and said second system applies the second signal to said motor.

5. An apparatus according to claim 1, further comprising:
    a detector system which detects a vibration of said table; and
    an extraction system which extracts a component of the detected vibration with respect to each motion mode of said table.

6. An apparatus according to claim 5, wherein said detector system includes a plurality of detectors each of which detects a vibration of said table in a predetermined direction.

7. An apparatus according to claim 5, wherein said first system generates first components of the first signal based on the components of the detected vibration, respectively.

8. An apparatus according to claim 7, further comprising a distribution system which distributes second components of the first signal to actuators included in said actuator system, respectively, based on the first components.

9. An apparatus according to claim 1, further comprising at least one of:
    a third system which applies to said actuator system a third signal for causing said actuator system to apply the force based on a position of said table and a target position of said table; and
    a fourth system which applies to said actuator system a fourth signal for causing said actuator system to apply the force based on a velocity of said table.

10. An apparatus according to claim 1, wherein said first and second systems include first and second compensators which compensate for detected vibrations of said table, respectively, and said apparatus further comprises a table which has values used for said first and second compensators, respectively, in correspondence.

11. An exposure apparatus for exposing a substrate to a pattern, said apparatus comprising:
    an anti-vibration apparatus as defined in claim 1.

12. An apparatus according to claim 11, further comprising a stage which supports at least a substrate and is supported by said anti-vibration apparatus.

13. A device manufacturing method comprising:
    a step of exposing a substrate to a pattern using an exposure apparatus defined in claim 11.

14. A device manufacturing method comprising:
    a step of exposing a substrate to a pattern using an anti-vibration apparatus as defined in claim 1.

15. A method adapted for an anti-vibration apparatus including a table and an actuator system which applies a force to the table, said method comprising steps of:
    applying to the actuator system a first signal for causing the actuator system to apply the force in proportion to a displacement of the table; and
    applying to the actuator system a second signal for causing the actuator system to apply the force based on an acceleration of the table,
    wherein the first and second signals are generated so that a natural vibration mode of a system including the table and the actuator system is unchanged.

* * * * *

UNITED STATES PATENT AND TRADEMARK OFFICE
CERTIFICATE OF CORRECTION

PATENT NO. : 6,771,354 B2
APPLICATION NO. : 10/289263
DATED : August 3, 2004
INVENTOR(S) : Kato It is certified that error appears in the above-identified patent and that said Letters Patent is hereby corrected as shown below:

ON THE TITLE PAGE:
In item "(73) Assignee:," "Canon Kabushi Kaisha," should read -- Canon Kabushiki Kaisha, --.

COLUMN 9:
Line 7, "at a" should read -- at --.
Line 10, "accelerations" should read -- acceleration --.

Signed and Sealed this

Sixteenth Day of January, 2007

JON W. DUDAS
*Director of the United States Patent and Trademark Office*